(12) United States Patent
Matsumura et al.

(10) Patent No.: US 7,014,748 B2
(45) Date of Patent: Mar. 21, 2006

(54) ANODIZING METHOD, SUBSTRATE PROCESSING METHOD, AND SUBSTRATE MANUFACTURING METHOD

(75) Inventors: Satoshi Matsumura, Atsugi (JP); Kenji Yamagata, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 343 days.

(21) Appl. No.: 10/367,841

(22) Filed: Feb. 19, 2003

(65) Prior Publication Data
US 2003/0121773 A1 Jul. 3, 2003

Related U.S. Application Data

(62) Division of application No. 09/526,869, filed on Mar. 16, 2000, now Pat. No. 6,547,938.

(30) Foreign Application Priority Data
Mar. 25, 1999 (JP) .................................. 11-082352

(51) Int. Cl.
*C25D 11/32* (2006.01)
(52) U.S. Cl. ...................... 205/124; 205/316; 205/324; 205/333; 438/409; 438/455
(58) Field of Classification Search ................ 205/124, 205/149, 316, 324, 333
See application file for complete search history.

(56) References Cited

U.S. PATENT DOCUMENTS

| 3,994,784 | A | * | 11/1976 | Kapash | 205/70 |
|---|---|---|---|---|---|
| 4,127,459 | A | * | 11/1978 | Jumer | 205/686 |
| 4,236,978 | A | * | 12/1980 | Prengaman et al. | 205/188 |
| 5,032,244 | A | | 7/1991 | Bommier et al. | 204/224 R |
| 5,679,475 | A | * | 10/1997 | Yamagata et al. | 428/698 |
| 5,854,123 | A | * | 12/1998 | Sato et al. | 438/507 |
| 5,951,833 | A | | 9/1999 | Yamagata | 204/198 |
| 6,217,725 | B1 | * | 4/2001 | Van Anglen et al. | 204/207 |
| 6,280,602 | B1 | * | 8/2001 | Robertson | 205/775 |

FOREIGN PATENT DOCUMENTS

| EP | 0 846 790 A2 | 6/1998 |
|---|---|---|
| EP | 0 926 269 A2 | 6/1999 |
| JP | 6094737 A | 5/1985 |
| JP | A 02-228037 | 9/1990 |
| JP | 0521338 A | 1/1993 |

(Continued)

OTHER PUBLICATIONS

An Office Action in Korean language dated Feb. 21, 2002, in a counterpart foreign application issued by Korean patent office, and a Japanese translation of the office action.

(Continued)

*Primary Examiner*—Roy King
*Assistant Examiner*—William T. Leader
(74) *Attorney, Agent, or Firm*—Morgan & Finnegan, L.L.P.

(57) ABSTRACT

This invention is to reduce the influence of a gas generated by an anodizing reaction. A silicon substrate (101) to be processed is horizontally held. A negative electrode (129) is arranged on the upper side of the silicon substrate (101), and a positive electrode (114) is brought into contact with the lower surface of the silicon substrate (101). The space between the negative electrode (129) and the silicon substrate (101) is filled with an HF solution (132). The negative electrode (129) has a number of degassing holes (130) to prevent a gas generated by the anodizing reaction from staying on the lower side of the negative electrode (129).

4 Claims, 20 Drawing Sheets

FOREIGN PATENT DOCUMENTS

| | | |
|---|---|---|
| JP | A 05-101998 | 4/1993 |
| JP | A 05-291264 | 11/1993 |
| JP | 06338631 A | 12/1994 |
| JP | A 10-022249 | 1/1998 |
| JP | A 10-275798 | 10/1998 |

OTHER PUBLICATIONS

Kazuo Imai, "A New Dielectric Isolation Method Using Porous Silicon", Solid State Electronics vol. 24, Mar. 13, 1980, pp. 159-164.

* cited by examiner

ANODIZING METHOD, SUBSTRATE PROCESSING METHOD, AND SUBSTRATE MANUFACTURING METHOD

This is divisional of application Ser. No. 09/526,869, filed Mar. 16, 2000, now U.S. Pat. No. 6,547,938.

FIELD OF THE INVENTION

The present invention relates to an anodizing apparatus, an anodizing system, a substrate processing apparatus and method, and a substrate manufacturing method.

BACKGROUND OF THE INVENTION

Porous silicon was found by A. Uhlir and D. R. Turner who were studying electropolishing of single-crystal silicon biased to a positive potential in an aqueous solution of hydrofluoric acid.

Later, to exploit excellent reactivity of porous silicon, application of porous silicon to the element isolation process in manufacturing a silicon integrated circuit was examined, and a full isolation technology (FIFOS: Full Isolation by Porous Oxidized Silicon) using a porous silicon oxide film was developed (K. Imai, Solid State Electron 24, 159, 1981).

Recently, an applied technology to direct bonding has been developed in which a silicon epitaxial layer is grown on a porous silicon substrate, and the substrate is bonded to an amorphous substrate or single-crystal silicon substrate via the oxide film (Japanese Patent Laid-Open No. 5-21338).

As another application example, porous silicon has received a great deal of attention as a photoluminescence or electroluminescence material that emits light by itself (Japanese Patent Laid-Open No. 6-338631).

A conventional anodizing apparatus for manufacturing a substrate having a porous silicon layer will be described below.

FIG. 20 is a view showing the arrangement of a conventional anodizing apparatus (Japanese Patent Laid-Open No. 60-94737). In this anodizing apparatus, anodizing tanks 1902a and 1902b made of Teflon (tradename of du Pont in the U.S.A) as a material with HF resistance are arranged to sandwich a silicon substrate 1901 from both sides. The anodizing tanks 1902a and 1902b respectively have O-rings 1904a and 1904b for sealing at portions where the silicon substrate 1901 is held. The anodizing tanks 1902a and 1902b have platinum electrodes 1903a and 1903b, respectively. After the silicon substrate 1901 is sandwiched by the two anodizing tanks 1902a and 1902b, the anodizing tanks 1902a and 1902b are filled with HF solutions 1905a and 1905b, respectively. In this state, a DC voltage is applied between the electrodes by setting the platinum electrode 1903a as a negative electrode and the platinum electrode 1903b as a positive electrode. The silicon substrate 1901 is anodized, and a porous silicon layer is formed on the negative-electrode-side surface of the silicon substrate 1901.

In such conventional scheme of vertically holding a silicon substrate and anodizing it, a gas (e.g., hydrogen gas) generated by the anodizing reaction may stay on the surface of the silicon substrate for a long time or rise along the surface of the silicon substrate. In this case, the track of gas remains on the surface of the porous layer formed on the silicon substrate. This makes the porous layer nonuniform to result in poor quality and a decrease in yield and productivity. Hence, a demand has arisen for introduction of a new scheme of preventing a gas generated by the anodizing reaction from adversely affecting anodizing.

To obtain high quality and productivity for substrates having a porous silicon layer, it is important to reduce contamination of a silicon substrate during anodizing, and reduce contamination of a silicon substrate during a series of processes including anodizing and associated processes (e.g., washing and drying).

To increase productivity of substrates having a porous silicon layer, it is also important to increase the speed of the series of processes including anodizing and associated processes.

Additionally, in consideration of the recent tendency of an increase in diameter of silicon substrates, it is also important to propose a scheme capable of easily coping with the increase in diameter.

SUMMARY OF THE INVENTION

The present invention has been made in consideration of the above situation, and has as its object to provide a new anodizing scheme.

More specifically, it is an object of the present invention to, e.g., prevent any influence of a gas generated by an anodizing reaction.

It is another object of the present invention to, e.g., prevent any contamination of a substrate to be processed.

It is still another object of the present invention to, e.g., increase the speed of a series of processes including anodizing and associated processes.

It is still another object of the present invention to, e.g., facilitate to cope with an increase in diameter.

According to the first aspect of the present invention, there is provided an anodizing apparatus for anodizing a substrate, characterized by comprising a holding portion for substantially horizontally holding the substrate to be processed, a negative electrode arranged above the substrate to oppose the substrate, a positive electrode arranged under the substrate, and an anodizing tank for filling a space between the substrate and the negative electrode with an electrolyte, wherein the negative electrode has a function of preventing a gas from staying on a lower side.

In the anodizing apparatus according to the first aspect of the present invention, for example, the negative electrode preferably has a degassing hole for preventing the gas from staying on the lower side.

In the anodizing apparatus according to the first aspect of the present invention, for example, the positive electrode preferably supplies a current to the substrate to be processed while being in direct contact with a lower surface of the substrate in anodizing.

In the anodizing apparatus according to the first aspect of the present invention, for example, of the positive electrode, at least a portion which comes into contact with the substrate to be processed is preferably formed from a semiconductor material.

Preferably, the anodizing apparatus according to the first aspect of the present invention further comprises, e.g., an electrode support portion supporting the positive electrode, and the electrode support portion has a mechanism for attaching/detaching the positive electrode.

In the anodizing apparatus according to the first aspect of the present invention, for example, the positive electrode preferably has a chuck mechanism for chucking the substrate to be processed.

In the anodizing apparatus according to the first aspect of the present invention, for example, the chuck mechanism preferably comprises a vacuum chuck mechanism.

In the anodizing apparatus according to the first aspect of the present invention, for example, the holding portion preferably holds a peripheral portion of the lower surface of the substrate to be processed.

In the anodizing apparatus according to the first aspect of the present invention, for example, the holding portion preferably has a chuck portion for holding the substrate to be processed by chucking a peripheral portion of the lower surface of the substrate.

In the anodizing apparatus according to the first aspect of the present invention, for example, the-anodizing tank preferably has an opening portion at a bottom portion and can be filled with a liquid when the holding portion holds the substrate to be processed.

In the anodizing apparatus according to the first aspect of the present invention, for example, the positive electrode preferably comes into contact with the lower surface of the substrate to be processed, inside the opening portion.

The anodizing apparatus according to the first aspect of the present invention preferably further comprises, e.g., an electrode elevating mechanism for vertically moving the positive electrode.

The anodizing apparatus according to the first aspect of the present invention preferably further comprises, e.g., a rotary driving mechanism for rotating the substrate to be processed substantially in a horizontal plane to remove the liquid sticking to the substrate.

The anodizing apparatus according to the first aspect of the present invention preferably further comprises, e.g., a rotary driving mechanism for, after the substrate is released from the holding portion, rotating the positive electrode chucking the substrate substantially in a horizontal plane to rotate the substrate.

Preferably, in the anodizing apparatus according to the first aspect of the present invention, for example, the anodizing tank has, at a bottom portion, an opening portion for bringing the positive electrode into contact with the lower surface of the substrate to be processed, and the holding portion is arranged in an annular shape along the opening portion at the bottom portion of the anodizing tank and holds the peripheral portion of the lower surface of the substrate to be processed.

The anodizing apparatus according to the first aspect of the present invention preferably further comprises, e.g., an electrode elevating mechanism for vertically moving the positive electrode, and a rotary driving mechanism for, after the electrode elevating mechanism moves the substrate to be processed upward to a position where the substrate is not in contact with the holding portion, rotating the positive electrode chucking the substrate substantially in a horizontal plane to rotate the substrate.

The anodizing apparatus according to the first aspect of the present invention preferably further comprises, e.g., a substrate manipulation mechanism for receiving the substrate to be processed from a conveyor robot and causing the holding portion to hold the substrate.

The anodizing apparatus according to the first aspect of the present invention preferably further comprises, e.g., a substrate manipulation mechanism for receiving the substrate to be processed from a conveyor robot, causing the holding portion to hold the substrate, and transferring the processed substrate to the conveyor robot or another conveyor robot.

The anodizing apparatus according to the first aspect of the present invention preferably further comprises, e.g., an elevating mechanism for receiving the substrate to be processed from a conveyor robot at an upper portion of the anodizing tank, moving the substrate downward, and causing the holding portion to hold the substrate.

The anodizing apparatus according to the first aspect of the present invention preferably further comprises, e.g., a substrate elevating mechanism for receiving the substrate to be processed from a conveyor robot at an upper portion of the anodizing tank, moving the substrate downward, causing the holding portion to hold the substrate, receiving the processed substrate from the holding portion, moving the substrate upward, and transferring the substrate to the conveyor robot or another conveyor robot.

In the anodizing apparatus according to the first aspect of the present invention, for example, the elevating mechanism preferably has a support portion for supporting the substrate to be processed from the lower side and vertically moves the substrate placed on the support portion.

In the anodizing apparatus according to the first aspect of the present invention, for example, the support portion preferably receives/transfers the substrate to be processed from/to the conveyor robot in a substantially horizontal state.

In the anodizing apparatus according to the first aspect of the present invention, for example, the support portion preferably has a structure capable of receiving/transferring the substrate to be processed from/to the conveyor robot supporting the substrate from the lower side.

The anodizing apparatus according to the first aspect of the present invention preferably further comprises, e.g. a driving mechanism for moving the negative electrode.

In the anodizing apparatus according to the first aspect of the present invention, for example, the driving mechanism preferably removes the negative electrode from the anodizing tank when the substrate to be processed is to be held by the holding portion, and makes the negative electrode oppose the substrate when the substrate is to be anodized.

The anodizing apparatus according to the first aspect of the present invention preferably further comprises, e.g., a supply portion for supplying the electrolyte into the anodizing tank.

The anodizing apparatus according to the first aspect of the present invention preferably further comprises, e.g., a discharge portion for discharging the electrolyte from the anodizing tank.

The anodizing apparatus according to the first aspect of the present invention preferably further comprises, e.g., a circulation system for circulating the electrolyte while supplying the electrolyte into the anodizing tank and simultaneously discharging the electrolyte from the anodizing tank.

The anodizing apparatus according to the first aspect of the present invention preferably further comprises, e.g., a supply portion for supplying a cleaning solution into the anodizing tank after the substrate is anodized.

The anodizing apparatus according to the first aspect of the present invention preferably further comprises, e.g., a discharge portion for discharging the cleaning solution from the anodizing tank.

The anodizing apparatus according to the first aspect of the present invention can preferably be used as, e.g., an apparatus for filling the anodizing tank with the electrolyte to anodize the substrate and then filling the anodizing tank with the cleaning solution to wash the substrate.

The anodizing apparatus according to the first aspect of the present invention can preferably be used as, e.g., an apparatus for filling the anodizing tank with the electrolyte to anodize the substrate, filling the anodizing tank with the cleaning solution to wash the substrate, and then drying the substrate.

According to the second aspect of the present invention, there is provided an anodizing apparatus for anodizing a substrate, characterized by comprising an anodizing tank, a negative electrode, a positive electrode, a first supply portion for supplying an electrolyte to a space between the negative electrode and the substrate using the anodizing tank to anodize the substrate by applying a voltage between the negative electrode and the positive electrode, and a second supply portion for supplying a cleaning solution to the substrate using the anodizing tank to wash the anodized substrate.

The anodizing apparatus according to the second aspect of the present invention preferably further comprises, e.g., a rotary driving mechanism for rotating the washed substrate in the anodizing tank to dry the substrate.

According to the third aspect of the present invention, there is provided a processing apparatus for a substrate, characterized by comprising a process tank and processing means for performing, for the substrate in the process tank, at least two consecutive processes of anodizing, washing, and drying.

In the substrate processing apparatus according to the third aspect of the present invention, for example, the processing means preferably processes the substrate while keeping the substrate in a substantially horizontal state.

In the substrate processing apparatus according to the third aspect of the present invention, for example, the processing means preferably processes the substrate while supporting the substrate only from a lower side.

The substrate processing apparatus according to the third aspect of the present invention preferably further comprises, e.g., substrate manipulation means for receiving the substrate from a conveyor robot in a substantially horizontal state and processing the substrate, and transferring the processed substrate to the conveyor robot in the substantially horizontal state.

In the substrate processing apparatus according to the third aspect of the present invention, for example, the substrate manipulation means preferably manipulates the substrate by supporting the substrate only from the lower side.

According to the fourth aspect of the present invention, there is provided an anodizing system characterized by comprising any one of the above anodizing apparatuses, a conveyor robot for transferring an unprocessed substrate to the anodizing apparatus, receiving the processed substrate from the anodizing apparatus, and conveying the processed substrate to a predetermined position, and a control section for controlling anodizing by the anodizing apparatus and substrate conveyance by the conveyor robot.

According to the fifth aspect of the present invention, there is provided an anodizing system characterized by comprising any one of the above anodizing apparatuses, a conveyor robot for transferring an unprocessed substrate to the anodizing apparatus while supporting the substrate from a lower side in a substantially horizontal state, receiving the anodized substrate from the anodizing apparatus while supporting the substrate from the lower side in the substantially horizontal state, and conveying the anodized substrate to a predetermined position, and a control section for controlling anodizing by the anodizing apparatus and substrate conveyance by the conveyor robot.

According to the sixth aspect of the present invention, there is provided an anodizing system characterized by comprising any one of the above anodizing apparatuses, a washing/drying apparatus for washing and drying an anodized substrate, a conveyor robot for transferring an unprocessed substrate to the anodizing apparatus, receiving the anodized substrate from the anodizing apparatus, transferring the anodized substrate to the washing/drying apparatus, receiving the washed and dried substrate from the washing/drying apparatus, and conveying the washed and dried substrate to a predetermined position, and a control section for controlling anodizing by the anodizing apparatus, washing/drying by the washing/drying apparatus, and substrate conveyance by the conveyor robot.

According to the seventh aspect of the present invention, there is provided a processing method for a substrate, characterized by comprising the first step of substantially horizontally holding the substrate, making a negative electrode oppose an upper surface of the substrate, placing a positive electrode on a lower side of the substrate, and filling a space between the substrate and the negative electrode with an electrolyte, and the second step of applying a voltage between the negative electrode and the positive electrode to anodize the substrate while preventing a gas generated by an anodizing reaction from staying on a lower side of the negative electrode.

In the substrate processing method according to the seventh aspect of the present invention, for example, a negative electrode having a structure for preventing the gas from staying on the lower side is preferably used as the negative electrode.

In the substrate processing method according to the seventh aspect of the present invention, for example, a negative electrode having a degassing hole for preventing the gas from staying on the lower side is preferably used as the negative electrode.

According to the eighth aspect of the present invention, there is provided a processing method for a substrate, characterized by comprising the first step of anodizing the substrate using an anodizing tank, and the second step of washing the anodized substrate using the anodizing tank.

The substrate processing method according to the eighth aspect of the present invention preferably further comprises, e.g., the third step of drying the washed substrate in the anodizing tank.

According to the ninth aspect of the present invention, there is provided a method of manufacturing a substrate, characterized by comprising the steps of forming a porous layer on a surface of a substrate by any one of the above substrate processing methods, preparing a first substrate having at least a semiconductor layer on the porous layer, bonding a second substrate to a surface of the first substrate on a side of the semiconductor layer to prepare a bonded substrate stack, and separating the bonded substrate stack into two substrates at the porous layer.

Further objects, features and advantages of the present invention will become apparent from the following detailed description of the embodiments of the present invention with reference to the accompanying drawings.

DETAILED DESCRIPTION OF THE PREFERRED EMBODIMENTS

Preferred embodiments of the present invention will be described below.

As a representative example of a substrate having a porous silicon layer, which is manufactured by an anodizing apparatus according to a preferred embodiment of the present invention, a method of manufacturing an SOI substrate will be described first.

FIGS. 1A to 1E are views for explaining the steps in manufacturing an SOI substrate according to the preferred embodiment of the present invention.

Figure 1A:
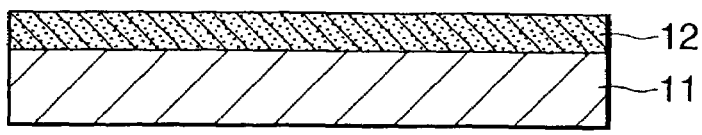
FIGS. 1A to 1E are views for explaining the steps in manufacturing an SOI substrate according to a preferred embodiment of the present invention.

In the step shown in FIG. 1A, a single-crystal Si substrate 11 is prepared, and a porous Si layer 12 is formed on the surface of the single-crystal Si substrate 11 using an anodizing apparatus according to an embodiment to be described later. As the porous Si layer 12, a porous layer having a multilayered structure having a plurality of layers with different porosities may be formed by changing the process conditions stepwise.

Figure 1B:
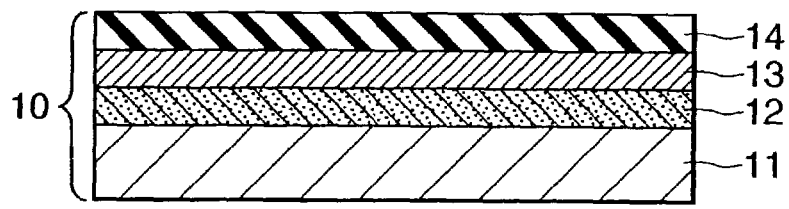

In the step shown in FIG. 1B, a single-crystal Si layer 13 as a non-porous layer is formed on the porous Si layer 12 by epitaxial growth. The surface of the single-crystal Si layer 13 is oxidized to form an $SiO_2$ layer 14 as a non-porous insulating layer. With this process, a first substrate 10 is formed.

Figure 1C:
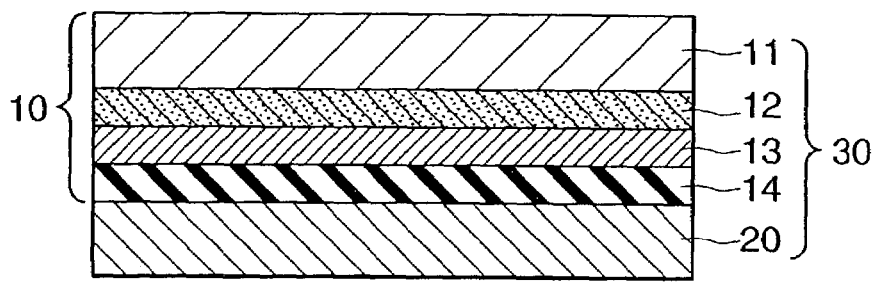

In the step shown in FIG. 1C, a single-crystal Si substrate is prepared as a second substrate 20. The first substrate 10 and second substrate 20 are brought into tight contact with each other at room temperature while making the $SiO_2$ layer 14 of the first substrate 10 oppose the second substrate 20. After that, these substrates may be subjected to anodic bonding, pressing, heating, or a combination thereof. With this processing, a bonded substrate stack 30 in which the second substrate 20 and $SiO_2$ layer 14 are firmly bonded is formed. The $SiO_2$ layer 14 may be formed either on the single-crystal Si substrate 11 side, on the second substrate 20, or on both substrates as far as the state shown in FIG. 1C is obtained upon bringing the first and second substrates into tight contact with each other.

Figure 1D:
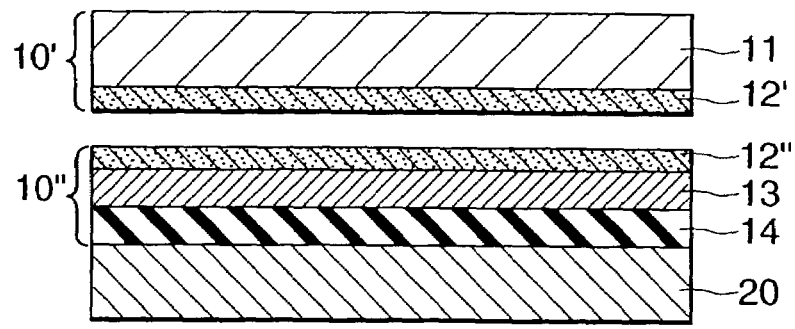

In the step shown in FIG. 1D, the bonded substrate stack 30 is separated at the porous Si layer 12. The second substrate side (10"+20) has a multilayered structure of porous Si layer 12"/single-crystal Si layer 13/insulating layer 14/single-crystal Si substrate 20. The first substrate side (10') has a structure wherein a porous Si layer 12' is formed on the single-crystal Si substrate 11.

After the remaining porous Si layer 12' is removed, and the surface on the first substrate side (10') after separation is planarized as needed, the first substrate is used as a single-crystal Si substrate 11 or a second substrate 20 for forming a first substrate 10 again.

Figure 1E:
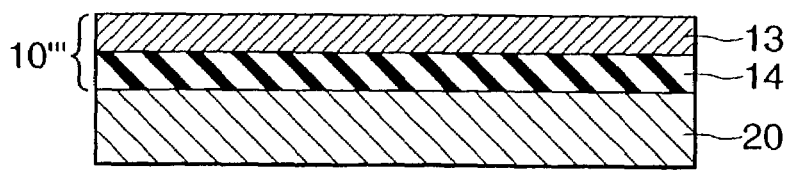

After the bonded substrate stack 30 is separated, in the step shown in FIG. 1E, the porous layer 12" on the surface on the second substrate side (10"+20) is selectively removed. With this process, a substrate having a multilayered structure of a single-crystal Si layer 13/insulating layer 14/single-crystal Si substrate 20, i.e., an SOI structure is obtained.

Formation of a porous silicon substrate by an anodizing reaction or formation of pores is performed in, e.g., an HF solution. It is known that the presence of holes in the silicon substrate is essential for this process. The reaction mechanism is estimated as follows.

First, holes in a silicon substrate applied with an electric field in an HF solution are induced on the surface of the silicon substrate on the negative electrode side. Consequently, the density of Si—H bonds compensating for the unbonded element on the surface of the silicon substrate becomes high. At this time, F ions in the HF solution on the negative electrode side nucleophilically attack the Si—H bonds to form Si—F bonds. By this reaction, $H_2$ molecules are generated, and simultaneously, one electron is emitted to the positive electrode side.

When Si—F bonds are formed, Si—Si bonds near the surface of the silicon substrate weaken due to the polarization characteristics of Si—F bonds. These weak Si—Si bonds are attacked by HF or $H_2O$, and Si atoms on the crystal surface form $SiF_4$ and are eliminated from the crystal surface. As a consequence, recessed portions are formed in the crystal surface. A field distribution (field concentration) for preferentially attracting holes is generated at this portion.

When this surface heterogeneity extends, etching of silicon atoms continuously progresses along the electric field.

As described above, since the presence of holes is essential for anodizing, a p-type silicon substrate is preferable as a substrate to be processed. However, an n-type silicon substrate can also be used by irradiating it with light to prompt hole generation.

The solution used for anodizing is not limited to the HF solution, and any other electrolytic solution can be used.

Anodizing apparatuses according to preferred embodiments of the present invention will be described below.

[First Embodiment]

FIGS. 2 to 9 are views showing the schematic arrangement of an anodizing apparatus according to the first embodiment of the present invention. FIG. 10 is a plan view showing part of an anodizing apparatus 100 shown in FIGS. 2 to 9.

In the anodizing apparatus 100 according to the first embodiment of the present invention, a series of processes including anodizing, washing, and drying can be executed. According to this anodizing apparatus 100, the substrate need not be conveyed between units for individually performing anodizing, washing, and drying. Hence, for example, 1) the productivity is high, 2) the substrate can be prevented from dropping, and 3) the apparatus can be made compact.

In the anodizing apparatus 100, the series of processes including anodizing, washing, and drying are performed while horizontally holding a substrate to be processed. Hence, for example, when a substrate is received from a conveyor robot which horizontally holds and conveys the substrate, the substrate can be subjected to the series of processes without rotating the substrate (e.g., vertically setting the substrate). For this reason, the substrate manipulation efficiency can be improved.

In the anodizing apparatus 100, anodizing, washing, and drying are performed while supporting a substrate to be processed from the lower side. Hence, the risk of dropping the substrate can be reduced.

In the anodizing apparatus 100, a substrate is anodized while substantially horizontally holding the substrate such that the surface on which a porous layer is to be formed is directed upward. With this arrangement, a gas generated by an anodizing reaction can be quickly removed from the substrate surface, and the gas can be prevented from moving along the substrate surface. According to this anodizing apparatus 100, a high-quality substrate can be manufactured at high yield. In the anodizing apparatus 100, a negative electrode opposing the substrate is arranged above the substrate because the substrate is substantially horizontally held such that the surface on which a porous layer is to be formed is directed upward. In this case, a gas (e.g., hydrogen gas) generated by the anodizing reaction stays on the lower side of the negative electrode, resulting in a decrease in anodizing efficiency. To prevent this, the anodizing apparatus 100 has a means for preventing a gas from staying on the lower side of the negative electrode, thereby preventing any decrease in anodizing efficiency.

In the anodizing apparatus 100, since a substrate manipulation member is brought into contact with only the lower surface of the substrate to be processed, i.e., the surface on which no porous layer is to be formed, contamination or damage to the substrate surface, i.e., the surface on which a porous layer is to be formed can be effectively prevented.

In the anodizing apparatus 100, since a current is supplied, via a silicon material, to the lower surface of the substrate to be processed, contamination of the lower surface of the substrate can be prevented.

In the anodizing apparatus 100, since a positive electrode is caused to chuck the substrate to be processed, satisfactory contact between the substrate and the positive electrode can be maintained, and failures in anodizing due to power supply errors can be reduced.

The arrangement of the anodizing apparatus 100 according to the first embodiment of the present invention will be described below.

The anodizing apparatus 100 has an elevating mechanism for a silicon substrate 101 to be processed as a mechanism for receiving the silicon substrate 101 from a conveyor robot and moving the substrate to the process position and also transferring the processed silicon substrate 101 to the conveyor robot or another conveyor robot. This elevating mechanism vertically moves the silicon substrate 101 while supporting the lower surface of the silicon substrate 101 from the lower side by three lift pins 111 standing on an annular member 110. The annular member 110 is coupled to the upper end of a rod 112 of an elevating actuator (e.g., an air cylinder) 113 and driven by the actuator 113.

The anodizing apparatus 100 has an anodizing tank (process tank) 102 on the upper side and a support member 131 for supporting the anodizing tank 102 on the lower side.

The anodizing tank 102 is made of a material having resistance to the process solution for anodizing. When an HF solution is employed as the process solution for anodizing, the anodizing tank 102 is preferably formed from polytetrafluoroethylene (tradename: Teflon) as an HF-resistant material.

A circular opening portion 103 is formed at the bottom portion of the anodizing tank 102 so that a positive electrode 114 can be brought into direct contact with the silicon substrate 110. An annular chuck pad 104 is attached to the bottom portion of the anodizing tank 102 along the opening portion 103. The chuck pad 104 is formed from, e.g., perfluoroethylene. The chuck pad 104 has on its surface an annular groove 104a for vacuum-chucking the silicon substrate 101. The groove 104a communicates with a vacuum line 134 through a suction hole 105. The vacuum line 134 is connected to a vacuum pump (not shown).

When the silicon substrate 101 is chucked by the chuck pad 104, the anodizing tank 102 can be filled with a process solution for anodizing or a process solution for washing.

The anodizing tank 102 has two injection ports 106a and 106b for injecting process solutions into the tank and two discharge ports 108a and 108b for discharging process solutions. The injection ports 106a and 106b communicate with process solution supply lines 107a and 107b, respectively. The discharge ports 108a and 108b communicate with process solution recovery lines 109a and 109b, respectively. Referring to FIGS. 2 to 9, only one set of injection port, discharge port, supply line, and recovery line are shown for the illustrative convenience.

In this embodiment, to anodize the silicon substrate 101, a circulation system for circulating a process solution (e.g., an HF solution) for anodizing by supplying it into the anodizing tank 102 through the supply line 107a and recovering the process solution through the recovery line 109a is constructed. To wash the anodized silicon substrate 101, a process solution for washing (e.g., pure water) is supplied into the anodizing tank 102 through the supply line 107b and recovered to a recovery tank through the recovery line 109b. Each process solution may be supplied from the upper side of the silicon substrate 101.

When the silicon substrate 101 is to be anodized, the anodizing tank 102 is filled with a process solution for anodizing. In this state, a negative electrode 129 is dipped into the process solution and made to oppose the silicon substrate 101. Simultaneously, the positive electrode 114 is brought into contact with the lower surface of the silicon substrate 101.

The negative electrode 129 has a plurality of degassing holes 130 to prevent a gas (e.g., hydrogen gas) generated by the anodizing reaction from staying on the lower side of the negative electrode 129. Instead of forming the degassing holes 130 in the negative electrode 129, a mesh-like negative electrode 129 may be used.

The negative electrode 129 is coupled to the shaft of a motor 127 through a coupling member 128 and manipulated by the motor 127. More specifically, when anodizing is to be performed, the negative electrode 129 is pivoted by the motor 127 to an opposite position of the silicon substrate 101. In this state, the electrode surface of the negative electrode 129 is set horizontally. When a process other than anodizing is to be performed, the negative electrode 129 is pivoted by the motor 127 to the upper side of the anodizing tank 102. The negative electrode 129 is connected to the negative electrode of a power supply unit (not shown).

The motor 127 also has a function of finely adjusting the interval between the negative electrode 129 and the silicon substrate 101 while keeping the negative electrode 129 and silicon substrate 101 substantially parallel. This allows a change in anodizing condition. However, the negative electrode 129 can be vertically moved by only a small amount while keeping the negative electrode 129 and silicon substrate 101 substantially parallel. To increase this amount, for example, a manipulation mechanism for moving the negative electrode 129 in the vertical direction is preferably employed.

The negative electrode 129 is preferably formed from a material having resistance to a process solution for anodizing. For example, when an HF solution is employed as the process solution for anodizing, the negative electrode 129 is preferably made of, e.g., platinum as an HF-resistant material.

The positive electrode 114 is preferably formed from the same material as that of the silicon substrate 101, i.e., a silicon material at at least a portion in contact with the silicon substrate 101. This silicon material preferably has a low resistivity. When the positive electrode 114 is made of a silicon material, the silicon substrate 101 can be prevented from being contaminated by the material of the positive electrode 114. Since the positive electrode 114 does not come into contact with the process solution (e.g., an HF solution) for anodizing, the surface of the positive electrode rarely changes its quality even when the positive electrode 114 is formed from a silicon material.

The positive electrode 114 has on its surface an annular groove 115 for vacuum chuck to chuck the lower surface of the silicon substrate 101. The groove 115 communicates with a vacuum line 120 through a suction hole 118 and sealing portion 119. The vacuum line 120 is connected to a vacuum pump (not shown). The suction hole 118 communicates with the side surface of a rotating shaft 135 through a lower electrode 116 and electrode support member 117. The annular sealing portion 119 is attached to the outer surface of the rotating shaft 135 to surround the outlet of the suction hole 118. The sealing portion 119 is coupled to the vacuum line 120. Hence, when the vacuum pump connected to the vacuum line 120 is actuated, the silicon substrate 101 can be chucked on the surface of the positive electrode 114.

The lower electrode 116 is an electrode for applying a voltage at an equipotential to the entire surface of the positive electrode 114. The lower electrode 116 preferably has a mechanism for attaching/detaching the positive electrode 114 such that the positive electrode 114 can be easily exchanged when it is contaminated or damaged.

The lower electrode 116 is connected to an annular electrode 121 fixed to the rotating shaft 135 through a lead line 122. The annular electrode 121 is connected to a lead line 123 through a contact brush (not shown). The lead line 123 is connected to the positive terminal of a power supply unit (not shown).

The lower electrode 116 is fixed on the electrode support member 117 formed from an insulating material. The electrode support member 117 is fixed to the rotating shaft 135 of a motor 124. Hence, the positive electrode 114, lower electrode 116, electrode support member 117, and rotating shaft 135 are integrally rotated by a driving force generated by the motor 124.

The motor 124 is fixed on a rod 125 of an elevating actuator (e.g., an air cylinder) 126. The motor 124 and the structure thereon are vertically moved by a driving force generated by the elevating actuator 126.

The support member 131 supports the anodizing tank 102 and also the elevating actuators 113 and 126.

Figure 9:
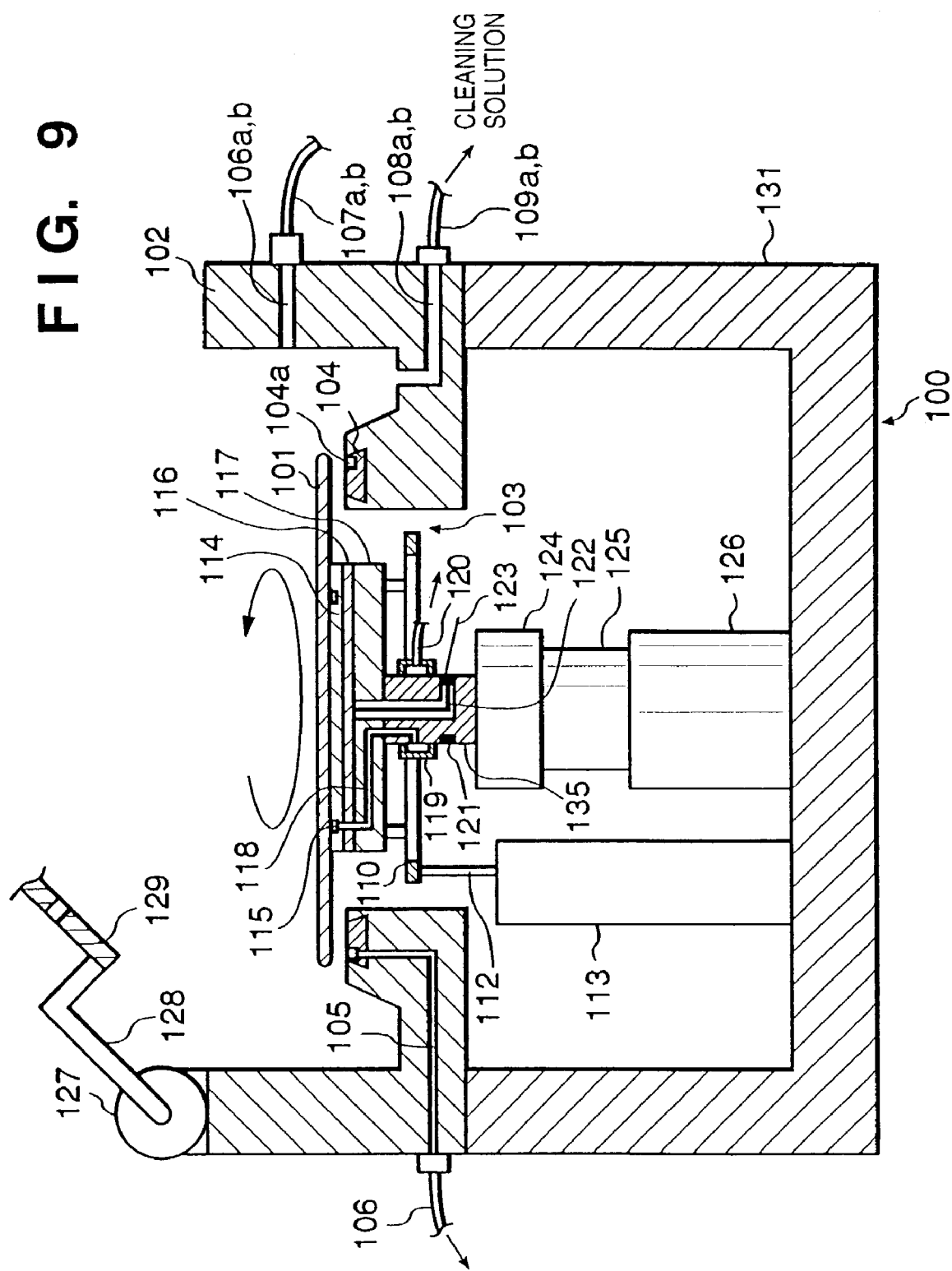
FIG. 9 is a view showing the schematic arrangement of the anodizing apparatus according to the first embodiment of the present invention.
Figure 10:
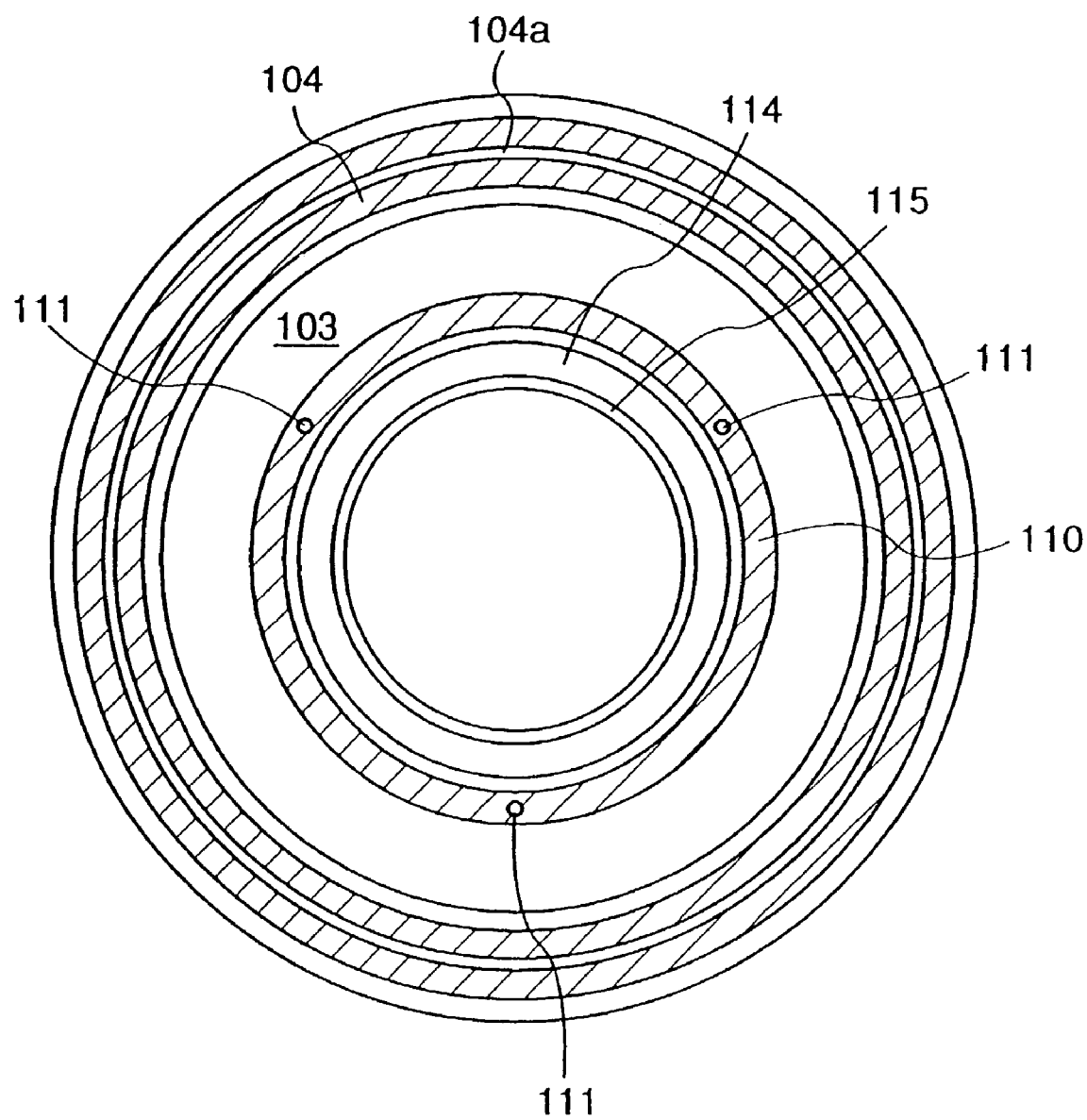
FIG. 10 is a plan view showing part of the anodizing apparatus shown in FIGS. 2 to 9.
Figure 11:
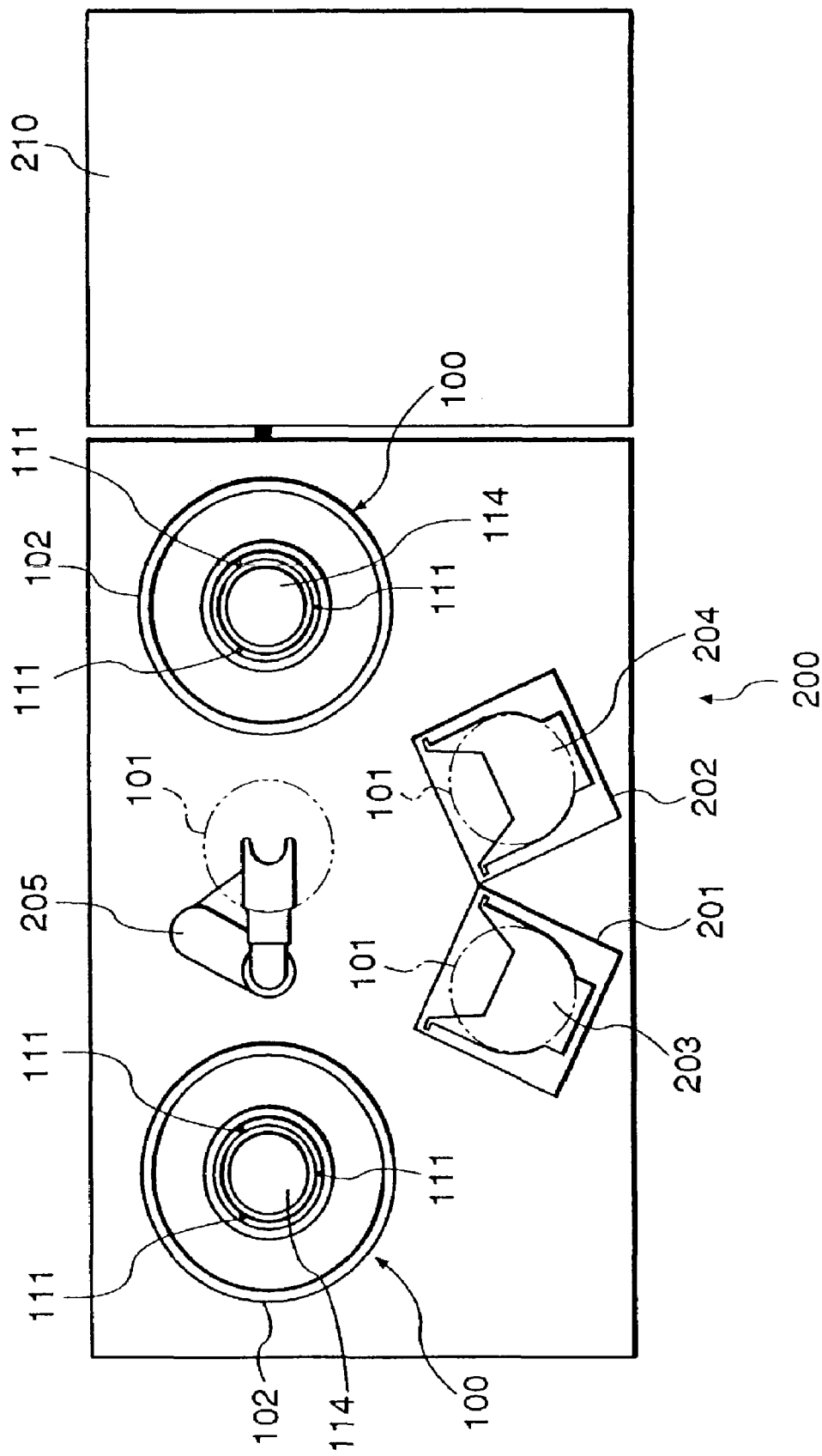
FIG. 11 is a plan view showing the schematic arrangement of an anodizing system having the anodizing apparatus shown in FIGS. 2 to 10.

FIG. 11 is a plan view showing the schematic arrangement of an anodizing system having the anodizing apparatus 100 shown in FIGS. 2 to 10.

An anodizing system 200 comprises two anodizing apparatuses 100 shown in FIGS. 2 to 10, a loader 201, an unloader 202, a conveyor robot 205, and a controller 210. In this anodizing system 200, the series of processes including anodizing, washing, and drying are executed parallelly using the two anodizing apparatuses 100, thereby improving the throughput. Three or more anodizing apparatuses may be used. This arrangement further improves the throughput.

Figure 12:
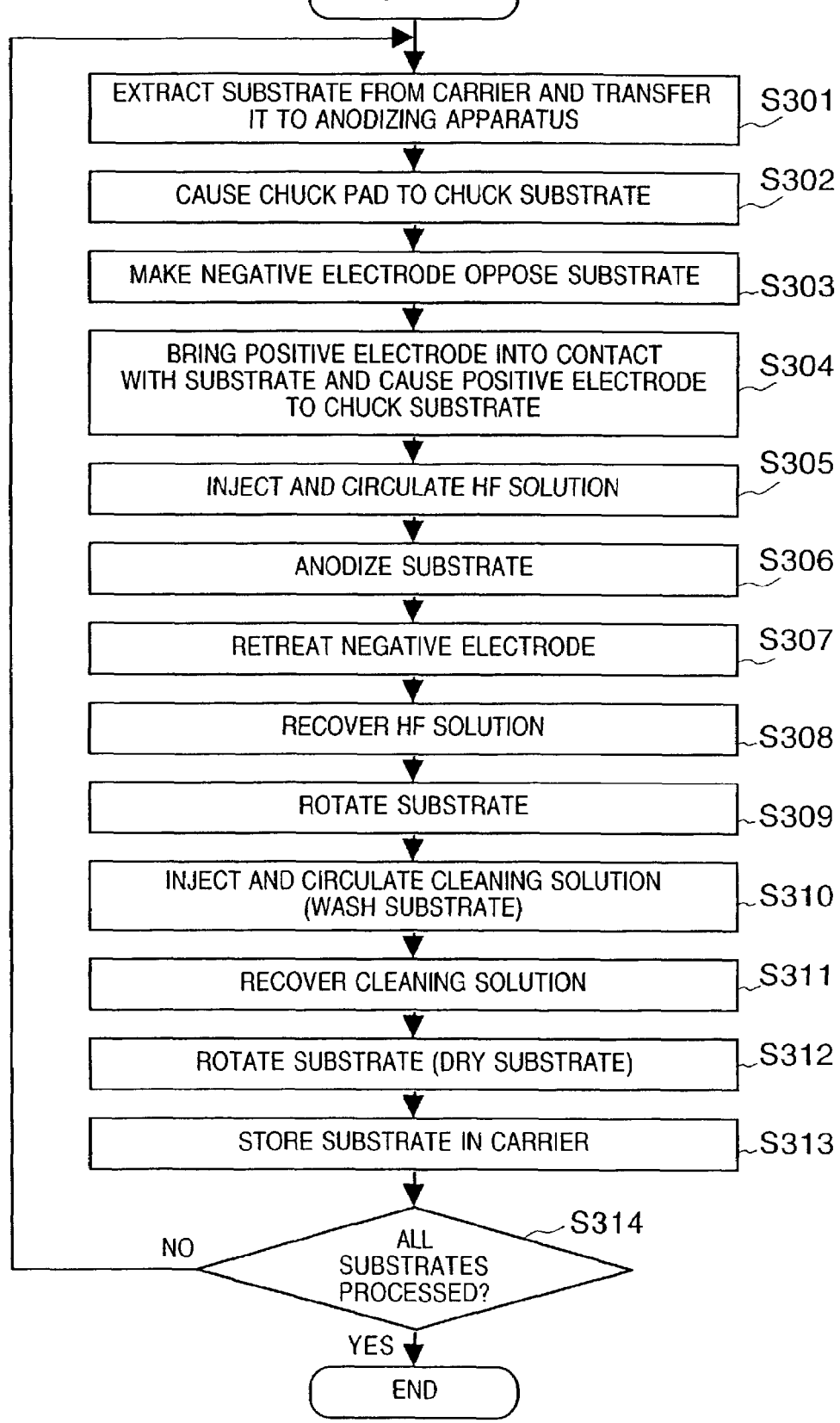
FIG. 12 is a flow chart showing the schematic operation of the anodizing system 200 shown in FIG. 11.

FIG. 12 is a flow chart showing the schematic operation of the anodizing system 200 shown in FIG. 11. Processes shown in this flow chart are controlled by the controller 210. The controller 210 has an input section (operation section) for inputting various instructions, a display section for displaying the process situation and the like, a memory storing a program, a CPU for executing the program, and a driving section for driving each unit in accordance with an instruction from the CPU. The controller 210 can be constructed by a general computer system.

The anodizing system 200 starts processes shown in FIG. 12 when a carrier 203 which stores an unprocessed silicon substrate 101 is set on the loader 201, a carrier 204 for storing a processed silicon substrate 101 is set on the unloader 202, and the user instructs to start processes. For the descriptive convenience, only processes using one anodizing apparatus 100 will be described below. In fact, this anodizing system 200 can simultaneously process two silicon substrates 101 using two anodizing apparatuses 100.

Figure 2:
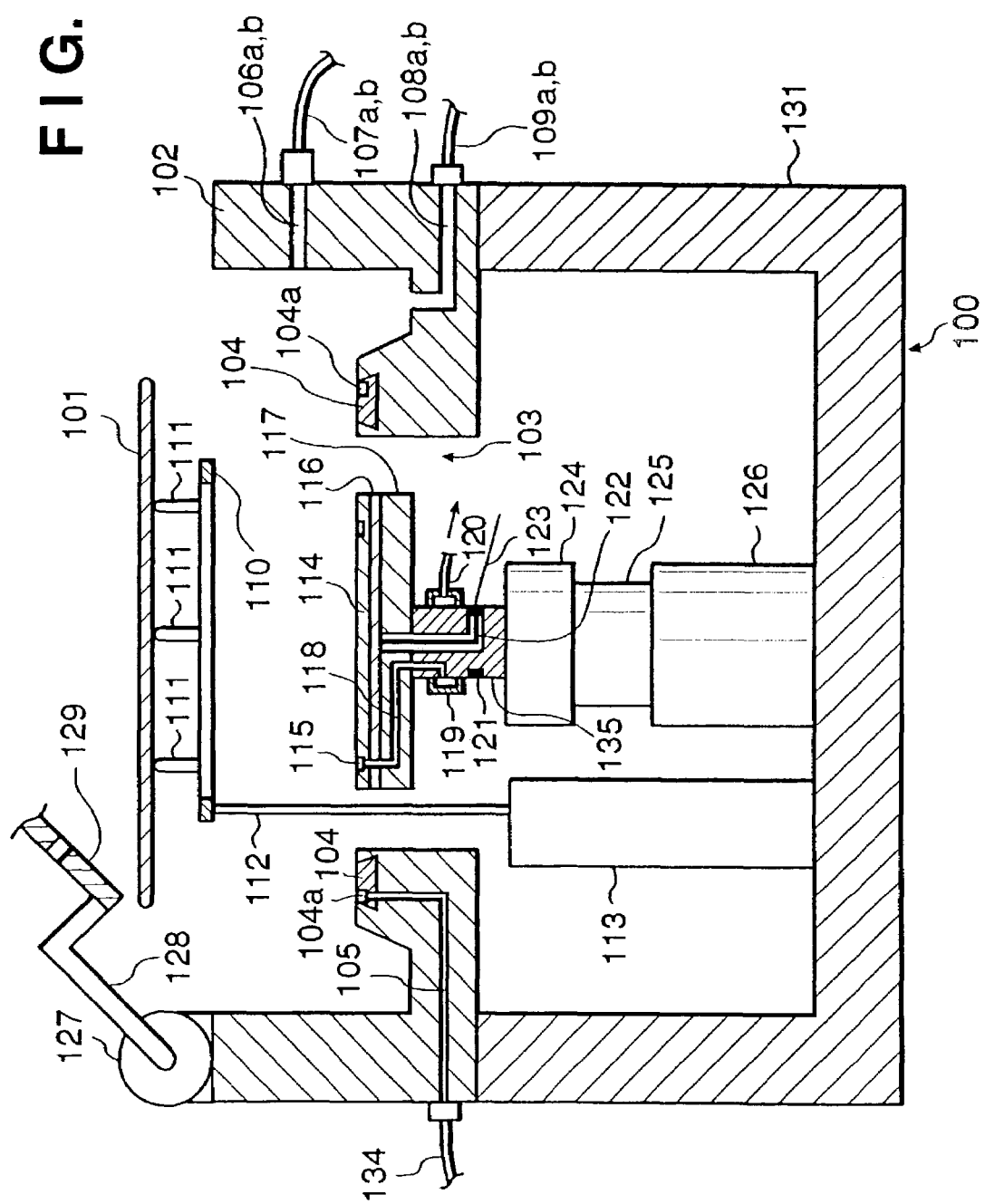
FIG. 2 is a view showing the schematic arrangement of an anodizing apparatus according to the first embodiment of the present invention.

First, in step S301, the elevating actuator 113 moves the lift pins 111 upward, as shown in FIG. 2. The conveyor robot 205 extracts the silicon substrate 101 horizontally stored in the carrier 203 on the loader 201 by supporting the lower surface of the substrate from the lower side, and places the silicon substrate 101 on the lift pins 111 while keeping the substrate horizontal.

Figure 3:
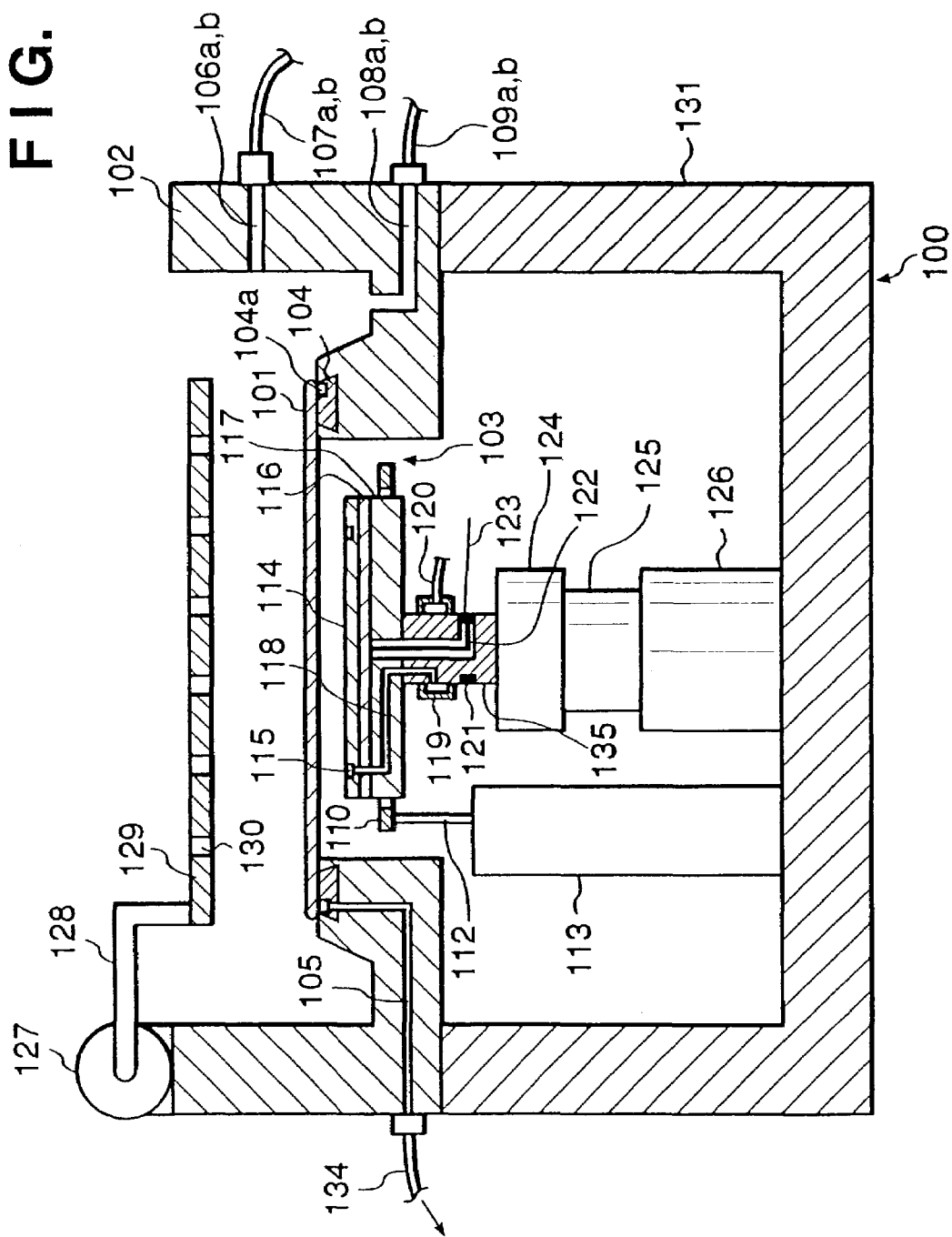
FIG. 3 is a view showing the schematic arrangement of the anodizing apparatus according to the first embodiment of the present invention.

In step S302, as shown in FIG. 3, the elevating actuator 113 moves the lift pins 111 supporting the silicon substrate 101 from the lower side to the lower end. In the course of downward movement of the lift pins 111 to the lower end, the silicon substrate 101 is supported from the lower side by the chuck pad 104 at the bottom portion of the anodizing tank 102. Pressure in the groove 104a of the chuck pad 104 is reduced to cause the chuck pad 104 to chuck the silicon substrate 101.

In step S303, as shown in FIG. 3, the negative electrode 129 is made to oppose the silicon substrate 101 by the motor 127.

In step S304, the elevating actuator 126 moves the positive electrode 114 upward and brings the surface of the positive electrode 114 into contact with the lower surface of the silicon substrate 101. Pressure in the groove 115 on the surface of the positive electrode 114 is reduced to cause the positive electrode 114 to chuck the silicon substrate 101.

Figure 4:
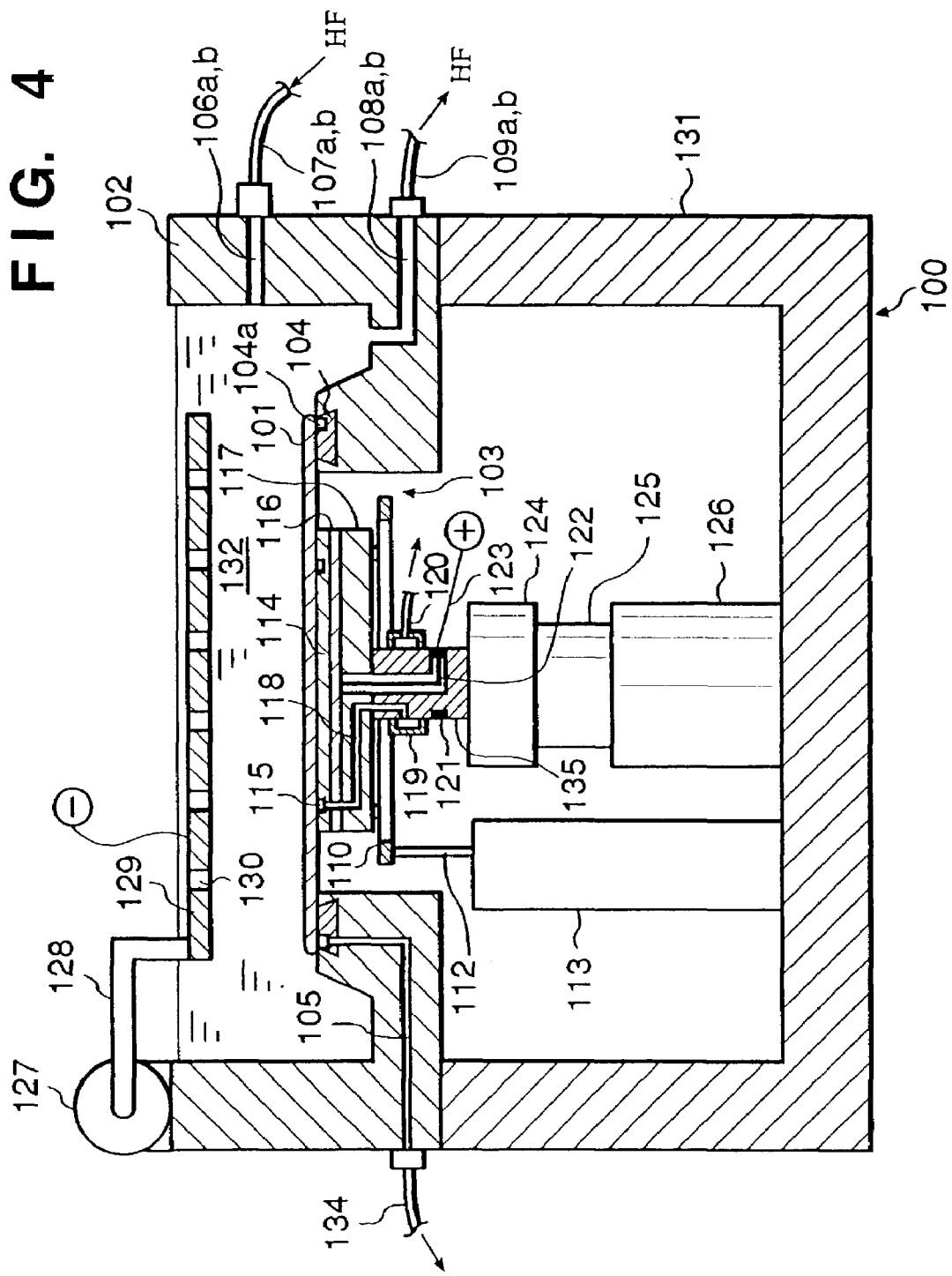
FIG. 4 is a view showing the schematic arrangement of the anodizing apparatus according to the first embodiment of the present invention.

In step S305, as shown in FIG. 4, an HF solution 132 as a process solution (electrolyte) for anodizing is injected into the anodizing tank 102 from the injection port 106a through the supply line 107a to fill the tank with the solution. At the same time, the HF solution is circulated by a circulation system (not shown) while discharging the HF solution 132 from the discharge port 108a through the recovery line 109a.

This circulation system includes not only the anodizing tank 102, injection port 106a, discharge port 108a, supply line 107a, and recovery line 109a but also a tank storing the HF solution 132, circulation pump, and filter. This circulation system may also include a densitometer and a concentration adjustment unit for increasing/decreasing the concentration of the HF solution 132 in accordance with the measurement result by the densitometer and the target concentration. The concentration of the HF solution 132 can be measured by, e.g., measuring the absorbance.

In step S306, as shown in FIG. 4, while circulating the HF solution 132, a voltage is applied between the negative electrode 129 and the positive electrode 114 by a power supply unit (not shown) to anodize the silicon substrate 101. With this process, a porous silicon layer is formed on the surface of the silicon substrate 101. The power supply unit has a function of adjusting the voltage and current to be output under the control of the controller 210.

Figure 5:
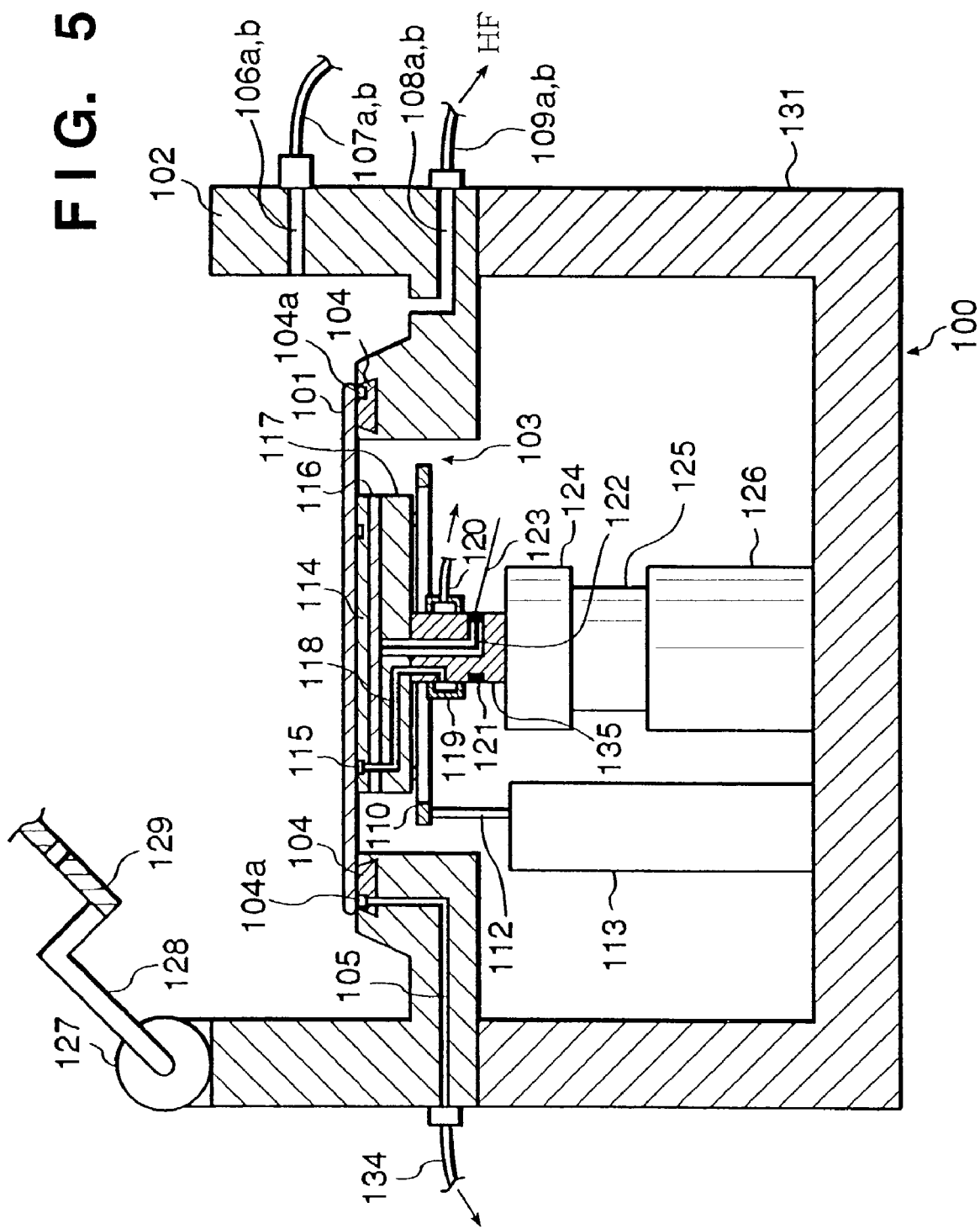
FIG. 5 is a view showing the schematic arrangement of the anodizing apparatus according to the first embodiment of the present invention.

In step S307, as shown in FIG. 5, the negative electrode 129 is retreated upward by the motor 127.

In step S308, as shown in FIG. 5, supply of the HF solution is stopped, and the HF solution is recovered from the anodizing tank 102 through the recovery line 109a.

Figure 6:
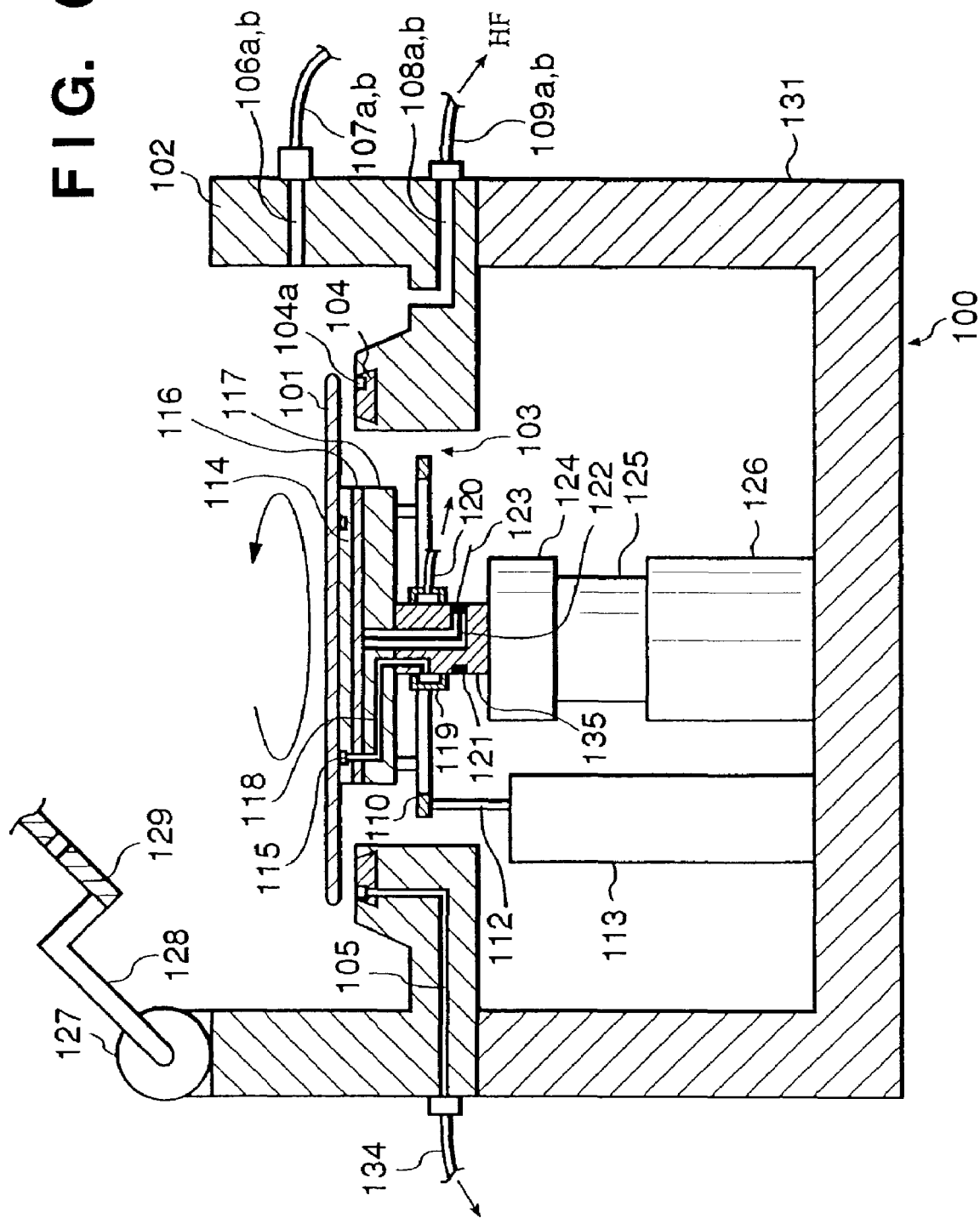
FIG. 6 is a view showing the schematic arrangement of the anodizing apparatus according to the first embodiment of the present invention.
Figure 7:
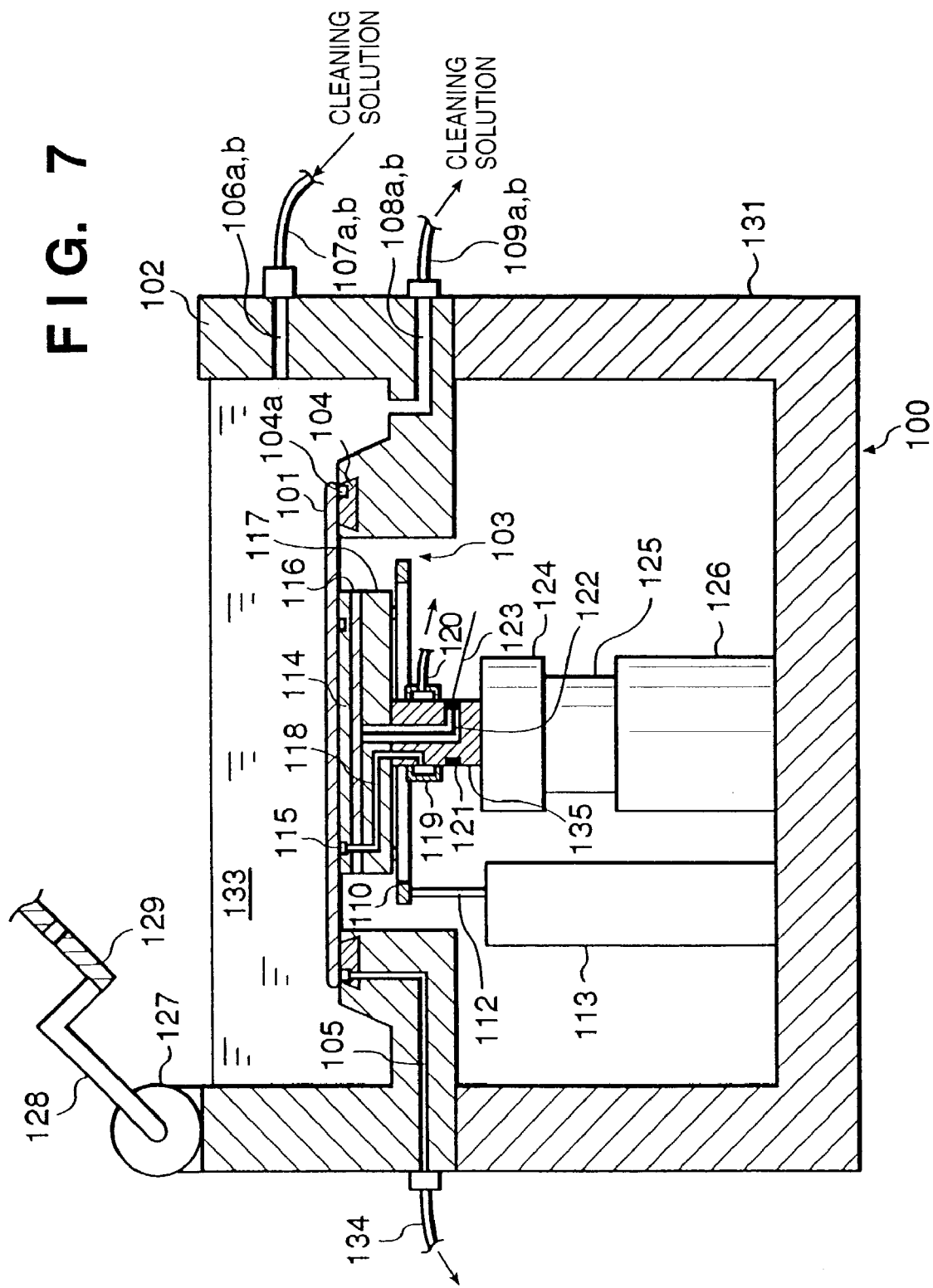
FIG. 7 is a view showing the schematic arrangement of the anodizing apparatus according to the first embodiment of the present invention.

In step S309, as shown in FIG. 6, the silicon substrate 101 is released from the chuck pad 104. The silicon substrate 101 is moved upward by the elevating actuator 126 and rotated at a high speed by the motor 124. With this operation, the HF solution sticking to the silicon substrate 101 is removed by a centrifugal force. Next, as shown in FIG. 7, the elevating actuator 126 moves the silicon substrate 101 downward until the lower surface of the silicon substrate 101 comes into contact with the chuck pad 104. After that, the chuck pad 104 is caused to chuck the silicon substrate 101. Note that it is also effective to execute the series of processes at a higher speed by omitting step S309.

In step S310, as shown in FIG. 7, a process solution (cleaning solution) 133 for washing is injected into the anodizing tank 102 from the injection port 106b through the supply line 107b to fill the tank. At the same time, the silicon substrate 101 is washed while recovering the cleaning solution 133 to a recovery tank from the discharge port 108b through the recovery line 109b.

As the cleaning solution 133, for example, pure water containing a surfactant is preferably used. More specifically, as the cleaning solution 133, pure water containing about 5% to 10% of alcohol as a surfactant is preferably used. When a cleaning solution containing a surfactant is used, the cleaning solution can be caused to effectively enter a number of pores in the porous silicon layer formed on the silicon substrate 101.

It is also effective to supply a surfactant to the silicon substrate 101 in the first step and then supply pure water to the silicon substrate 101 in the second step to wash the silicon substrate 101.

Alternatively, an ultrasonic cleaning method may be applied to execute this washing process while supplying an ultrasonic wave to the silicon substrate 101. When an ultrasonic wave is supplied, the washing time can be shortened.

Figure 8:
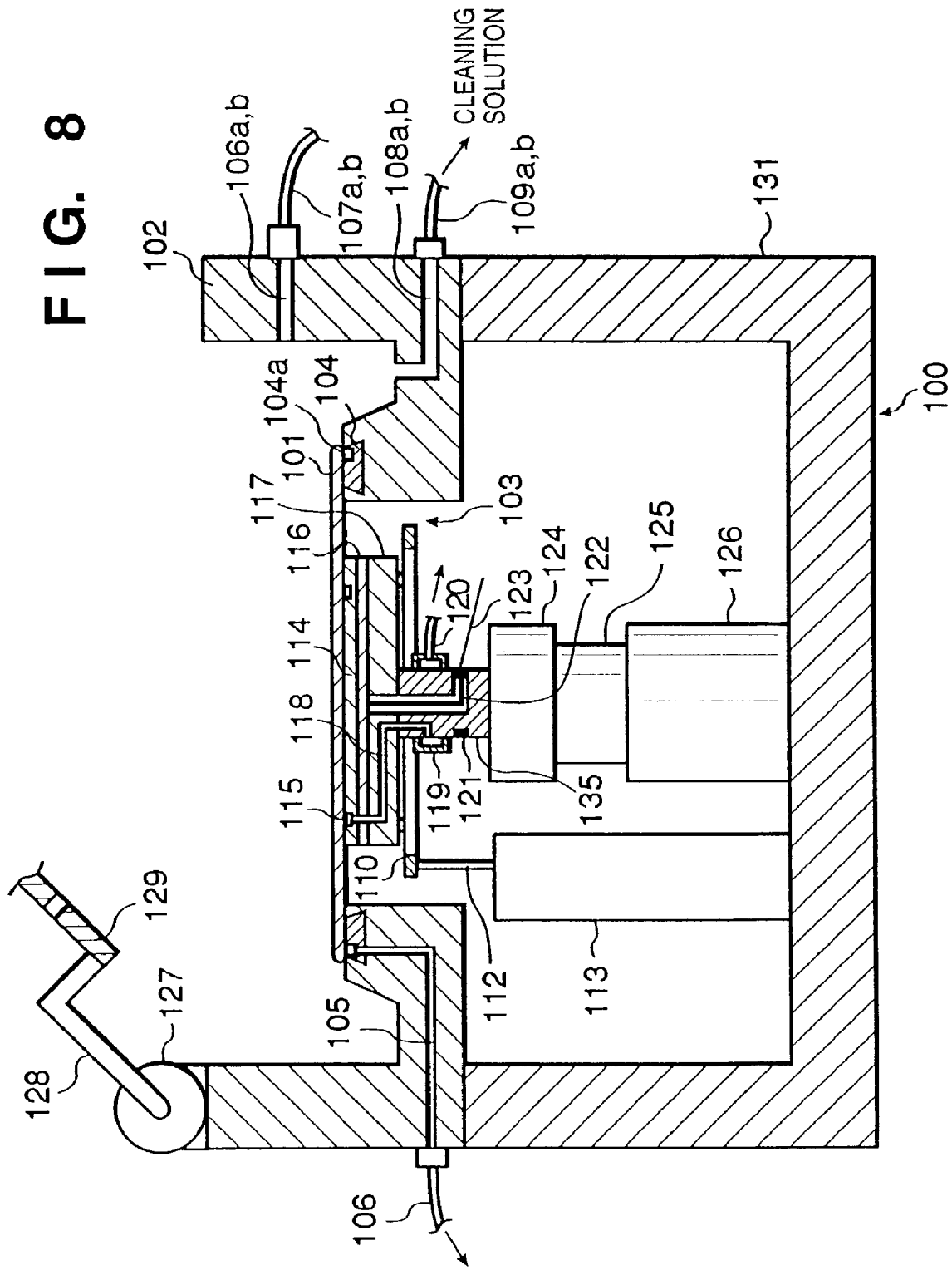
FIG. 8 is a view showing the schematic arrangement of the anodizing apparatus according to the first embodiment of the present invention.

In step S311, as shown in FIG. 8, supply of the cleaning solution is stopped, and the cleaning solution is recovered from the anodizing tank 102 into the recovery tank through the recovery line 109b.

In step S312, as shown in FIG. 9, the silicon substrate 101 is released from the chuck pad 104. The silicon substrate 101 is moved upward by the elevating actuator 126 and rotated at a high speed by the motor 124. With this operation, the cleaning solution sticking to the silicon substrate 101 is removed by a centrifugal force so as to dry the silicon substrate 101.

In step S313, chuck of the silicon substrate 101 by the positive electrode 114 is canceled. At the same time, as shown in FIG. 2, the elevating actuator 113 moves the lift pins 111 upward to move the silicon substrate 101 upward to a predetermined position while keeping the silicon substrate 101 horizontally supported by the lift pins 111 from the lower side. Next, the conveyor robot 205 receives the silicon substrate 101 on the lift pins 111 by supporting it from the lower side and stores the silicon substrate in the carrier 204 on the unloader 202 while keeping the horizontal state.

In step S314, it is determined whether an unprocessed silicon substrate 101 remains. If YES in step S314, the flow returns to step S301 to execute the processes in steps S301 to S313 for the silicon substrate 101. If NO in step S314, the series of processes are ended.

[Second Embodiment]

An automatic anodizing apparatus according to the second embodiment of the present invention will be described below. The automatic anodizing apparatus of this embodiment has an anodizing apparatus 100 according to the first embodiment as an apparatus for performing anodizing, and a separate post-processing apparatus as an apparatus for executing washing and drying.

FIGS. 13 to 16 are views showing the schematic arrangement of the post-processing apparatus according to the second embodiment of the present invention. FIG. 17 is a plan view showing the schematic arrangement of an anodizing system according to the second embodiment of the present invention.

The arrangement of a post-processing apparatus 400 according to the preferred embodiment of the present invention will be described first with reference to FIGS. 13 to 16. This post-processing apparatus 400 schematically has the same arrangement as the anodizing apparatus 100 of the first embodiment except that some functions are omitted. More specifically, since the post-processing apparatus 400 is used to wash and dry an anodized silicon substrate, it has an arrangement obtained by omitting electrodes for anodizing and associated constituent elements from the anodizing apparatus 100 according to the first embodiment. Note that the anodizing apparatus 100 of the first embodiment can be directly used as the post-processing apparatus.

In the post-processing apparatus 400, a negative electrode 129, and a coupling member 128 and motor 127 as associated constituent elements are omitted. In the post-processing apparatus 400, a lower electrode 116 and a lead line 122, annular electrode 121, and lead line 123 as associated constituent elements are also omitted.

The post-processing apparatus 400 has a chuck portion 144' in place of a positive electrode 114. Like the positive electrode 114, the chuck portion 144' is preferably formed from a silicon material. When the chuck portion 144' is formed from a silicon material, a silicon substrate 101 can be prevented from being contaminated by the material of the chuck portion 114'.

The post-processing apparatus 400 has a support portion 401 for supporting the chuck portion 114' in place of an electrode support portion 117. The support portion 401 preferably has a mechanism for attaching/detaching the chuck portion 114' such that the chuck portion 114' can be easily exchanged when it is contaminated or damaged.

The post-processing apparatus 400 has a rotating shaft 402 in place of a rotating shaft 135. The rotating shafts 135 and 402 are different only in that the rotating shaft 135 has a structure for supplying power to the silicon substrate 101 while the rotating shaft 402 does not have the structure.

The post-processing apparatus 400 has, e.g., a process tank 102' having the same structure as that of the anodizing tank of the anodizing apparatus 100 according to the first embodiment.

An anodizing system 500 according to the preferred embodiment of the present invention will be described next with reference to FIG. 17. The anodizing system 500 comprises two anodizing apparatuses 100a and 100b shown in FIGS. 2 to 10, two post-processing apparatuses 400a and 400b shown in FIGS. 13 to 16, a loader 201, an unloader 202, a conveyor robot 205, and a controller 510. In this automatic anodizing system 500, anodizing, washing, and drying are executed parallelly using the two anodizing apparatuses and two post-processing apparatuses, thereby improving the throughput. Three or more anodizing apparatuses and post-processing apparatuses may be used. This arrangement further improves the throughput.

Figure 17:
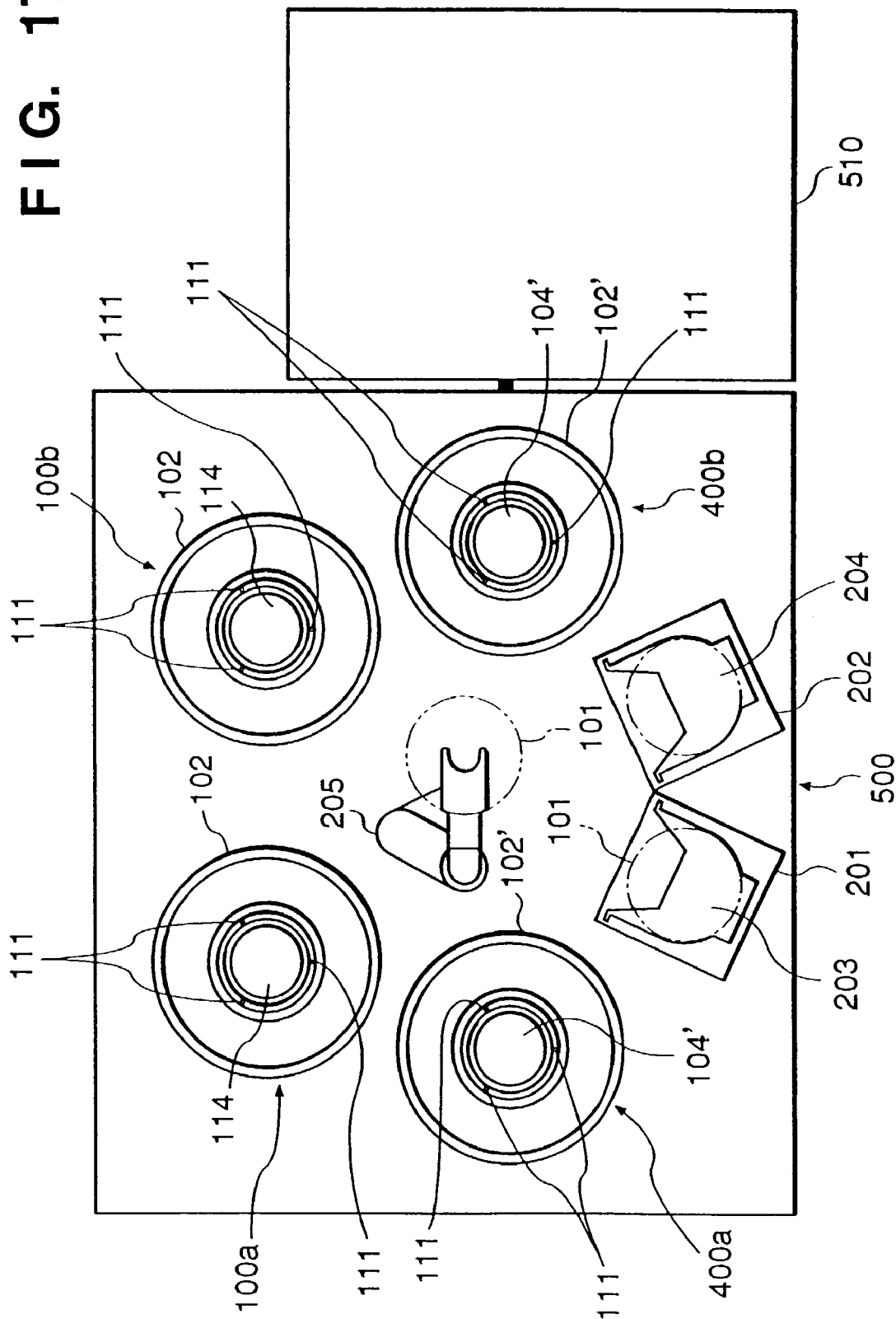
FIG. 17 is a plan view showing the schematic arrangement of an anodizing system according to the second embodiment of the present invention.
Figure 18:
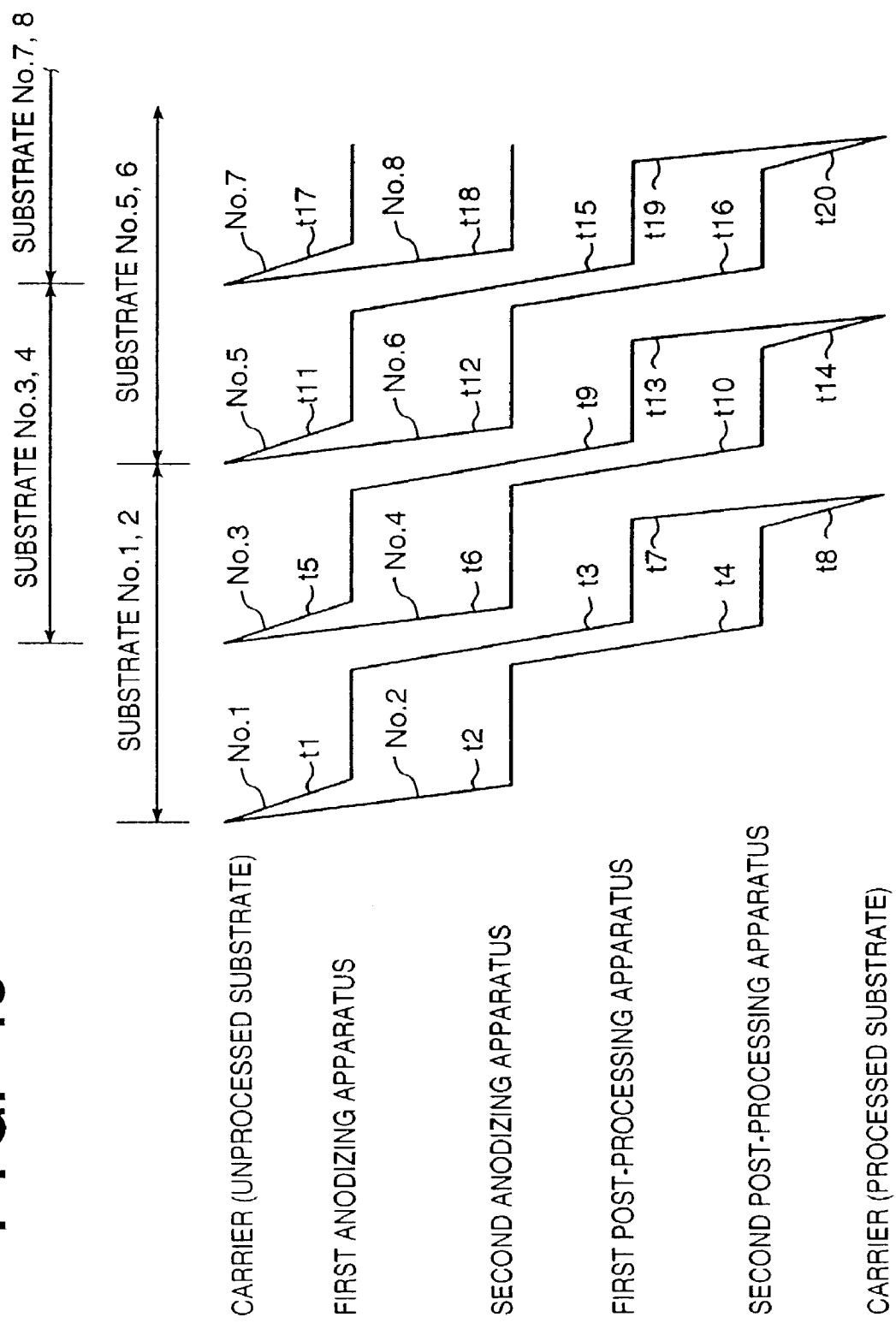
FIG. 18 is a view schematically showing the flow of processes of a silicon substrate by an anodizing system 500 shown in FIG. 17.

FIG. 18 is a view schematically showing the flow of processes of a silicon substrate by the anodizing system 500 shown in FIG. 17. Referring to FIG. 18, substrate No. x (e.g., substrate No. 1) indicates the number of a silicon substrate to be processed. In addition, tx (e.g., t1) indicates an operation sequence of the conveyor robot 205, and the silicon substrate 101 is conveyed in the order of t1, t2, t3, . . . Horizontal lines in FIG. 18 indicate processes by the first anodizing apparatus 100a, second anodizing apparatus 100b, first post-processing apparatus 400a, and second post-processing apparatus 400b. Oblique lines in FIG. 18 indicate conveyance by the conveyor robot 205.

In the anodizing system 500, anodizing and washing/drying are executed by different apparatuses. For this reason, a process solution for anodizing and process solution for washing (cleaning solution) can be prevented from mixing in the tank.

Figure 19:
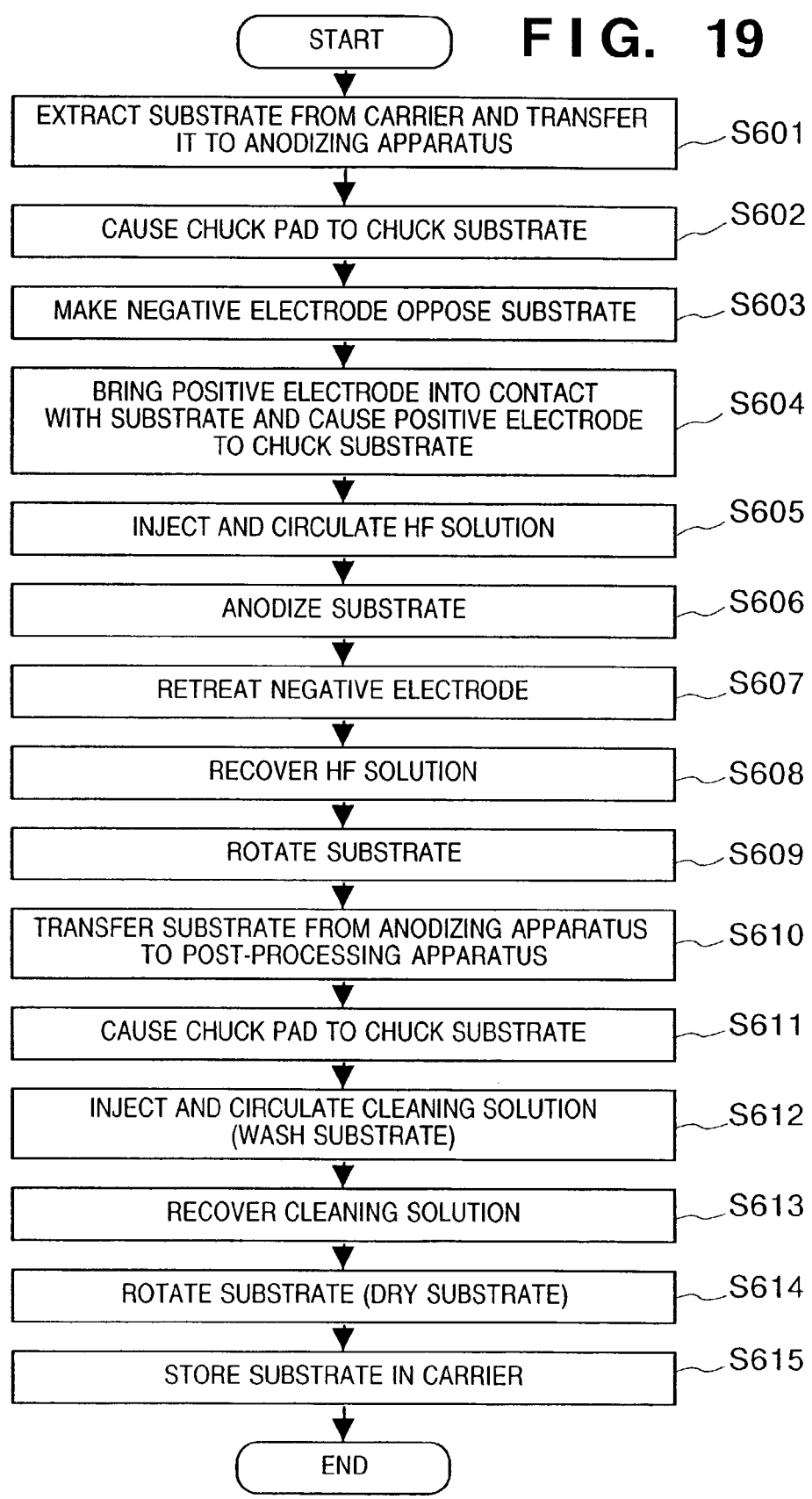
FIG. 19 is a flow chart schematically showing the operation of the anodizing system shown in FIG. 17 in processing one silicon substrate.
Figure 20:
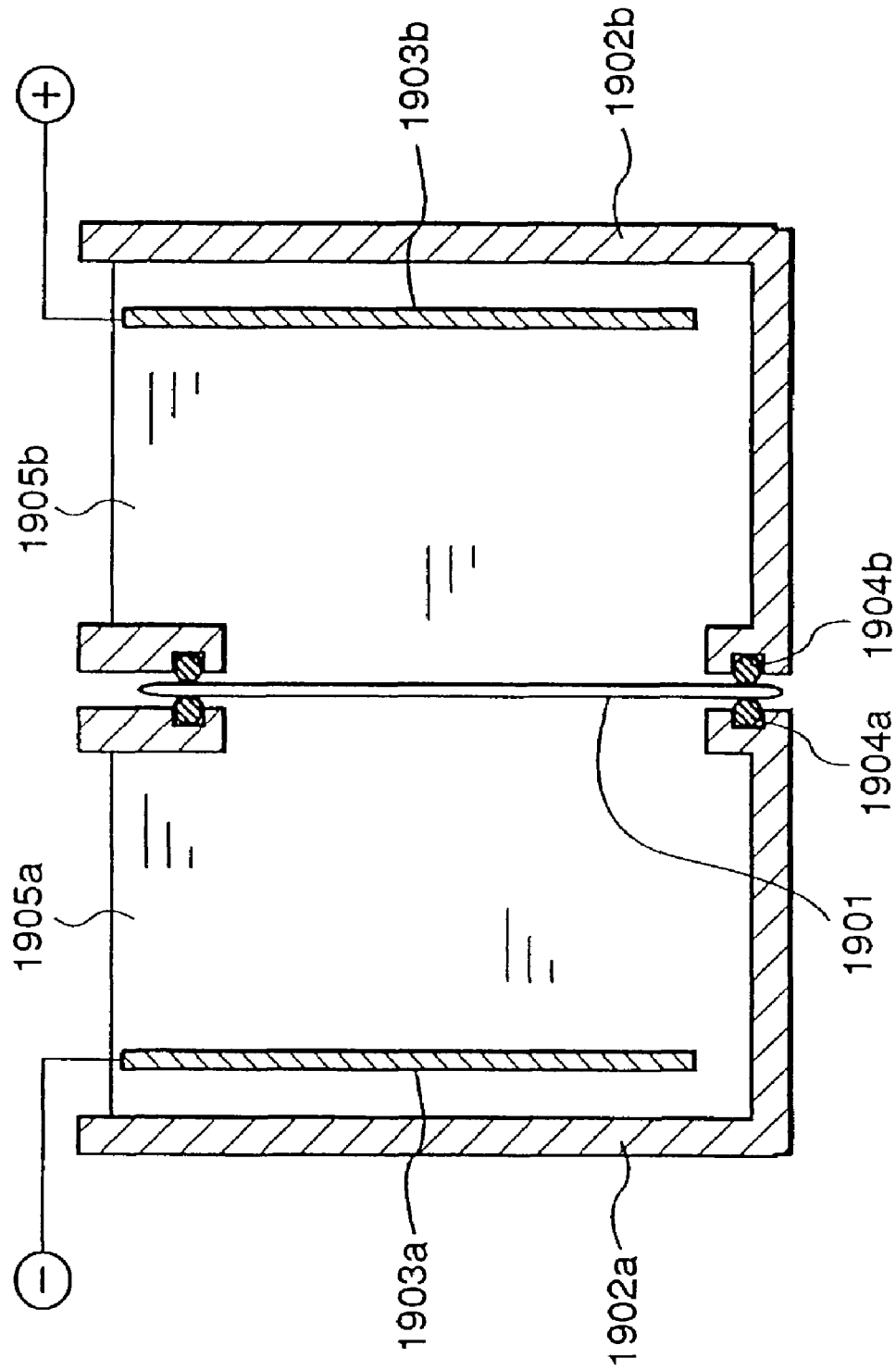
FIG. 20 is a view showing the arrangement of a conventional anodizing apparatus (Japanese Patent Laid-Open No. 60-94737).

FIG. 19 is a flow chart schematically showing the operation of the anodizing system shown in FIG. 17 in processing one silicon substrate.

First, in step S601, an elevating actuator 113 of the anodizing apparatus 100a or 100b moves lift pins 111 upward, as shown in FIG. 2. The conveyor robot 205 extracts the silicon substrate 101 horizontally stored in the carrier 203 on the loader 201 by supporting the lower surface of the substrate from the lower side, and places the silicon substrate 101 on the lift pins 111 of the anodizing apparatus 100a or 100b while keeping the substrate 101 horizontal.

In step S602, as shown in FIG. 3, the elevating actuator 113 of the anodizing apparatus 100a or 100b moves the lift pins 111 supporting the silicon substrate 101 from the lower side to the lower end. In the course of downward movement of the lift pins 111 to the lower end, the silicon substrate 101 is supported from the lower side by a chuck pad 104 at the bottom portion of an anodizing tank 102. Pressure in a groove 104a of the chuck pad 104 is reduced to cause the chuck pad 104 to chuck the silicon substrate 101.

In step S603, as shown in FIG. 3, a negative electrode 129 is made to oppose the silicon substrate 101 by a motor 127.

In step S604, an elevating actuator 126 of the anodizing apparatus 100a or 100b moves a positive electrode 114 upward and brings the surface of the positive electrode 114 into contact with the lower surface of the silicon substrate 101. Pressure in a groove 115 on the surface of the positive electrode 114 is reduced to cause the positive electrode 114 to chuck the silicon substrate 101.

In step S605, as shown in FIG. 4, an HF solution 132 as a process solution (electrolyte) for anodizing is injected into the anodizing tank 102 from an injection port 106a through a supply line 107a to fill the tank with the solution. At the same time, the HF solution 132 is circulated by a circulation system (not shown) while removing the HF solution 132 from a discharge port 108a through a recovery line 109a.

As described above, this circulation system includes not only the anodizing tank 102, injection port 106a, discharge port 108a, supply line 107a, and recovery line 109a but also a tank storing the HF solution 132, circulation pump, and filter. The circulation system may also include a densitometer and a concentration adjustment unit for increasing/decreasing the concentration of the HF solution 132 in accordance with the measurement result by the densitometer and the target concentration. The concentration of the HF solution 132 can be measured by, e.g., measuring the absorbance.

In step S606, as shown in FIG. 4, while circulating the HF solution 132, a voltage is applied between the negative electrode 129 and the positive electrode 114 by a power supply unit (not shown) to anodize the silicon substrate 101. With this process, a porous silicon layer is formed on the surface of the silicon substrate 101. The power supply unit has a function of adjusting the voltage and current to be output under the control of the controller 510.

In step S607, as shown in FIG. 5, the negative electrode 129 is retreated upward by a motor 127.

In step S608, as shown in FIG. 5, supply of the HF solution is stopped, and the HF solution is recovered from the anodizing tank 102 through the recovery line 109a.

In step S609, as shown in FIG. 6, the silicon substrate 101 is released from the chuck pad 104. The silicon substrate 101 is moved upward by the elevating actuator 126 and rotated at a high speed by the motor 124. With this operation, the HF solution sticking to the silicon substrate 101 is removed by a centrifugal force.

In step S610, first, the silicon substrate 101 is released from the positive electrode 114. Simultaneously, as shown in FIG. 2, the elevating actuator 113 moves the lift pins 111 upward to move the silicon substrate 101 upward to a predetermined position while keeping the silicon substrate 101 horizontally supported by the lift pins 111 from the lower side.

Figure 13:
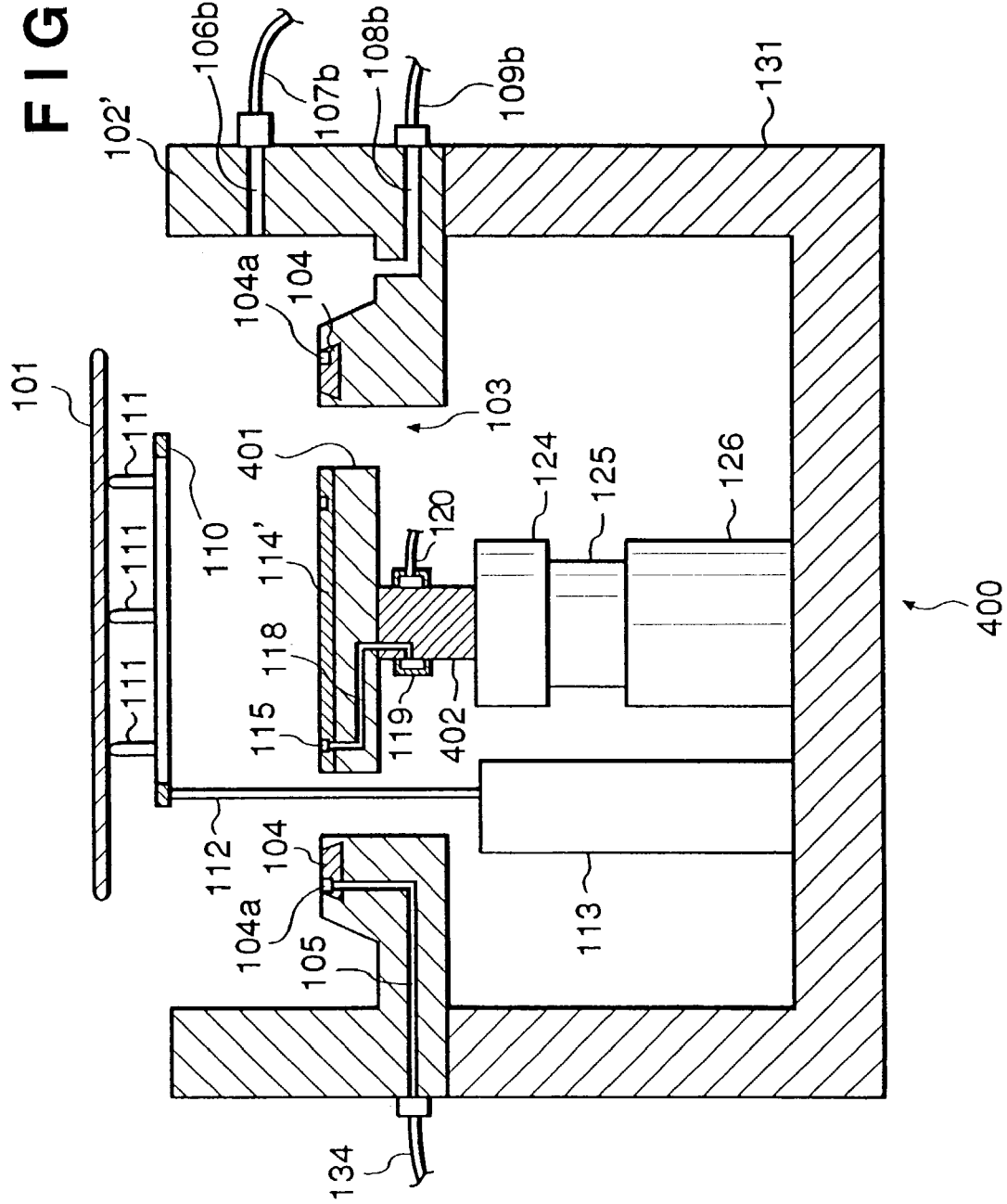
FIG. 13 is a view showing the schematic arrangement of a post-processing apparatus according to the second embodiment of the present invention.

Parallelly to this operation, in the post-processing apparatus 400a or 400b, the elevating actuator 113 moves the lift pins 111 upward, as shown in FIG. 13.

The conveyor robot 205 receives the silicon substrate 101 on the lift pins 111 of the anodizing apparatus 100a or 100b by supporting the substrate from the lower side and places it on the lift pins 111 of the post-processing apparatus 400a or 400b while keeping the silicon substrate 101 set horizontally.

Figure 14:
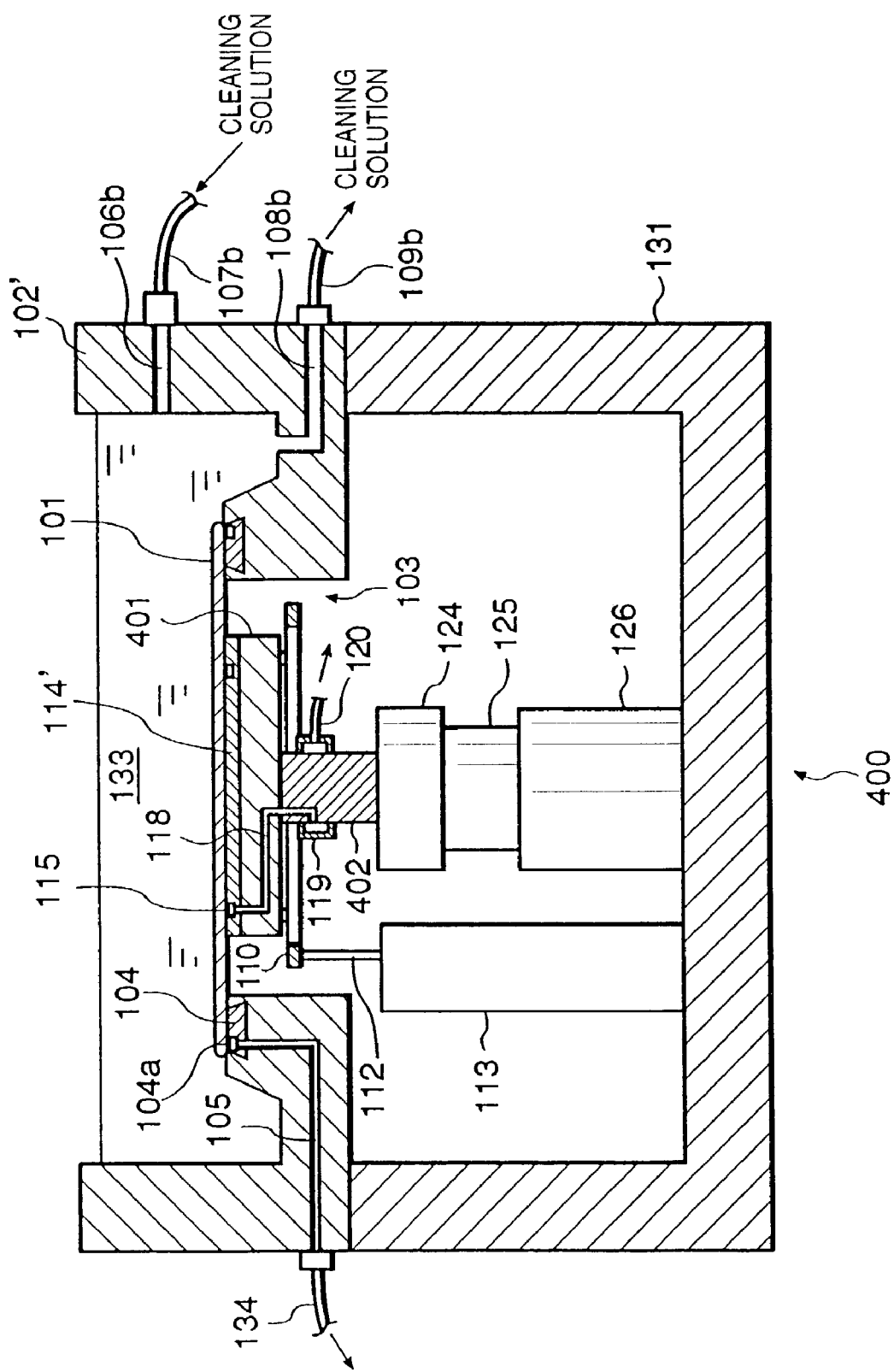
FIG. 14 is a view showing the schematic arrangement of the post-processing apparatus according to the second embodiment of the present invention.

In step S611, as shown in FIG. 14, the elevating actuator 126 of the post-processing apparatus 400 moves the lift pins 111 to the lower end to bring the lower surface of the silicon substrate 101 into contact with the chuck pad 104. After that, the chuck pad 104 is caused to chuck the silicon substrate 101.

In step S612, as shown in FIG. 14, a process solution (cleaning solution) 133 for washing is injected into the process tank 102' of the post-processing apparatus 400a or 400b from an injection port 106b through a supply line 107b to fill the tank. At the same time, the silicon substrate 101 is washed while recovering the cleaning solution 133 to a recovery tank from a discharge port 108b through a recovery line 109b.

As the cleaning solution 133, for example, pure water containing a surfactant is preferably used. More specifically, as the cleaning solution 133, pure water containing about 5% to 10% of alcohol as a surfactant is preferably used. When a cleaning solution containing a surfactant is used, the cleaning solution can be caused to effectively enter the porous silicon layer formed on the silicon substrate 101.

It is also effective to supply a surfactant to the silicon substrate 101 in the first step and then supply pure water to the silicon substrate 101 in the second step to wash the silicon substrate 101.

Alternatively, an ultrasonic cleaning method may be applied to execute this washing process while supplying an ultrasonic wave to the silicon substrate 101. When an ultrasonic wave is supplied, the washing time can be shortened.

Figure 15:
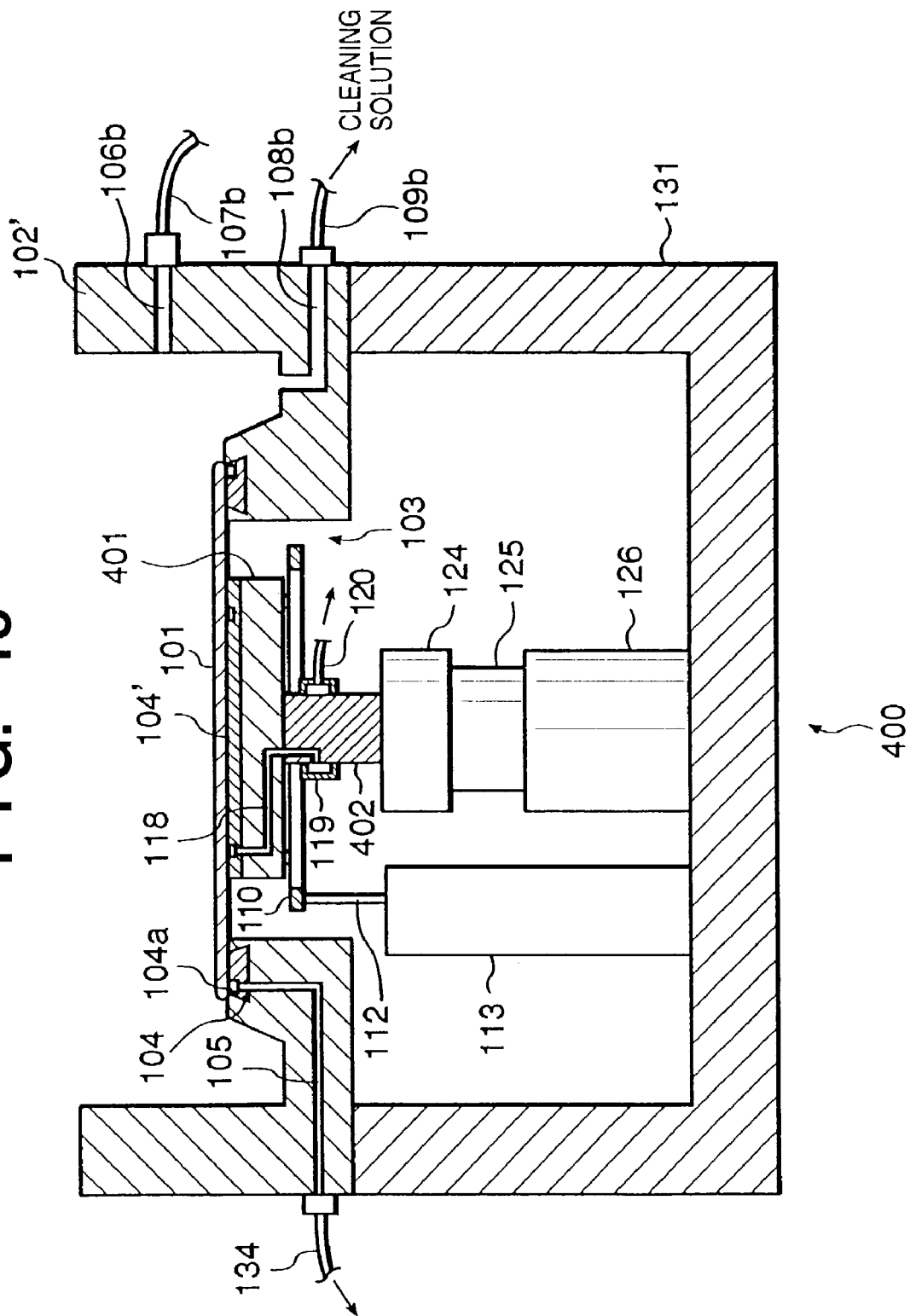
FIG. 15 is a view showing the schematic arrangement of the post-processing apparatus according to the second embodiment of the present invention.

In step S613, as shown in FIG. 15, supply of the cleaning solution is stopped, and the cleaning solution is recovered from the process tank 102' of the post-processing apparatus 400a or 400b into the recovery tank through the recovery line 109b.

Figure 16:
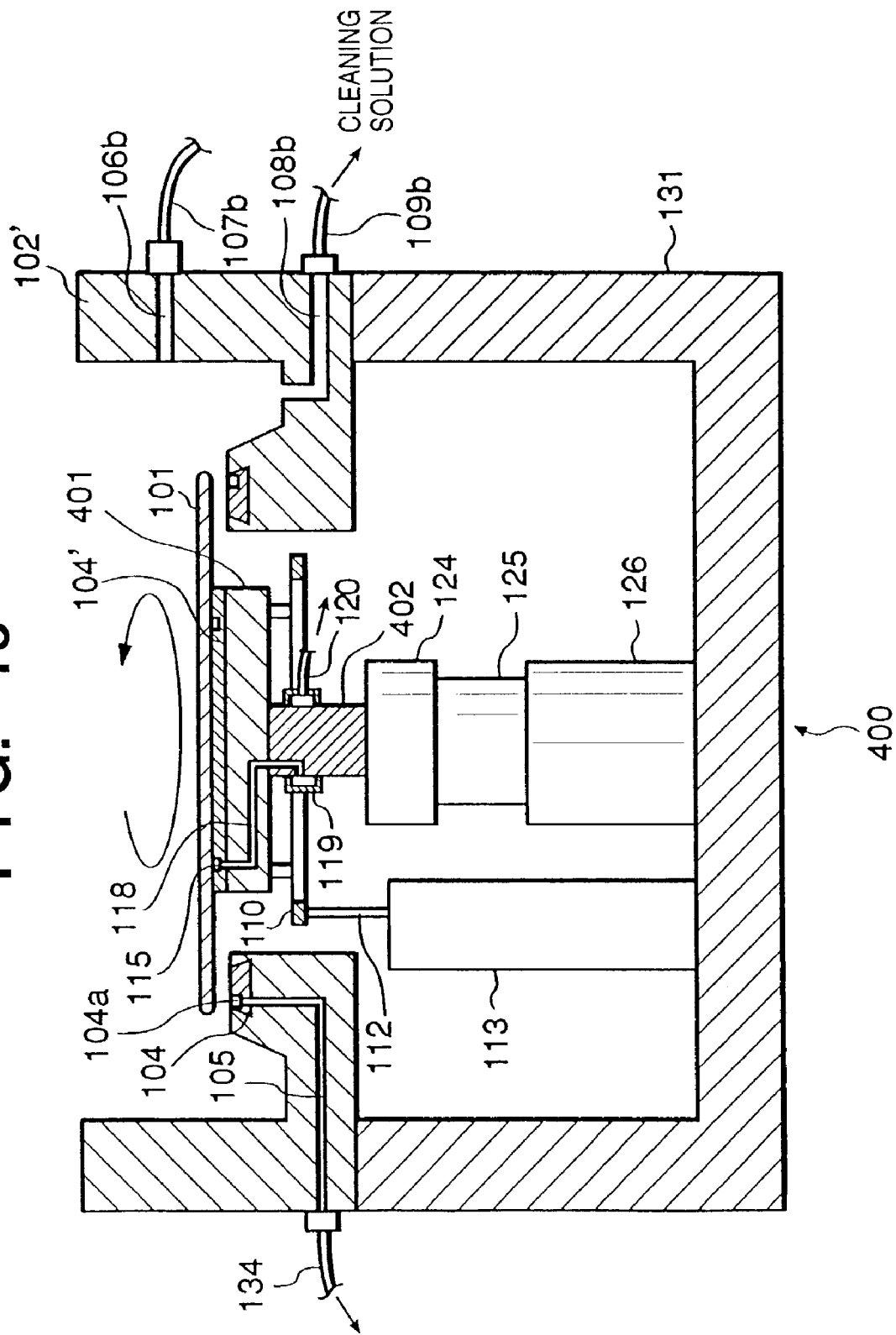
FIG. 16 is a view showing the schematic arrangement of the post-processing apparatus according to the second embodiment of the present invention.

In step S614, as shown in FIG. 16, the silicon substrate 101 is released from the chuck pad 104. The silicon substrate 101 is moved upward by the elevating actuator 126 and rotated at a high speed by the motor 124. With this operation, the cleaning solution sticking to the silicon substrate 101 is removed by a centrifugal force so as to dry the silicon substrate 101.

In step S615, the silicon substrate 101 is released from the positive electrode 114. At the same time, as shown in FIG. 13, the elevating actuator 113 of the post-processing apparatus 400a or 400b moves the lift pins 111 upward to move the silicon substrate 101 upward to a predetermined position while keeping the silicon substrate 101 horizontally supported by the lift pins 111 from the lower side. Next, the conveyor robot 205 receives the silicon substrate 101 on the lift pins 111 by supporting it from the lower side and stores the silicon substrate in the carrier 204 on the unloader 202 while keeping the horizontal state.

According to the present invention, for example, the substrate to be processed is horizontally held, the negative electrode is arranged above the substrate, and a gas is prevented from staying on the lower side of the negative electrode, thereby reducing the influence of the gas generated by the anodizing reaction.

According to the present invention, for example, of the positive electrode, at least a portion that comes into contact with the substrate to be processed is formed from a semiconductor material, thereby reducing contamination of the substrate.

According to the present invention, for example the substrate to be processed is supported only from the lower side, thereby reducing contamination of the substrate.

According to the present invention, for example, at least two consecutive processes of anodizing, washing, and drying are executed in one process tank, thereby increasing the speed of anodizing and a series of associated processes.

According to the present invention, for example, the substrate is transferred between the apparatuses while keeping it in the horizontal state. This effectively prevents, e.g., drop of the substrate and facilitates to cope with the increase in substrate diameter.

According to the present invention, for example, a series of processes are executed while supporting the substrate from the lower side in the horizontal state. This effectively prevents, e.g., drop of the substrate and facilitates to cope with the increase in substrate diameter.

The present invention is not limited to the above embodiments and various changes and modifications can be made within the spirit and scope of the present invention. Therefore, to apprise the public of the scope of the present invention, the following claims are made.

What is claimed is:

1. A processing method for a substrate, comprising:
the first step of substantially horizontally holding the substrate, pivoting a negative electrode horizontally to oppose an upper surface of the substrate, placing a positive electrode on a lower side of the substrate, and filling a space between the substrate and said negative electrode with an electrolyte;
the second step of applying a voltage between said negative electrode and said positive electrode to anodize the substrate while preventing a gas generated by an anodizing reaction from staying on a lower side of said negative electrode, and
the third step of pivoting vertically the negative electrode after the anodizing process is complete.

2. The method according to claim 1, wherein a negative electrode having a structure for preventing the gas from staying on the lower side is used as said negative electrode.

3. The method according to claim 1, wherein a negative electrode having a degassing hole for preventing the gas from staying on the lower side is used as said negative electrode.

4. A method of manufacturing a substrate, comprising the steps of:
forming a porous layer on a surface of a substrate by a substrate processing method of claim 1;
preparing a first substrate having at least a semiconductor layer on the porous layer;
bonding a second substrate to a surface of the first substrate on a side of the semiconductor layer to prepare a bonded substrate stack; and
separating the bonded substrate stack into two substrates at the porous layer.

* * * * *